(12) United States Patent
Terada et al.

(10) Patent No.: US 7,221,868 B2
(45) Date of Patent: May 22, 2007

(54) CAMERA AND PHOTOGRAPHING LENS BARREL

(75) Inventors: Hiroshi Terada, Mitaka (JP); Naohiro Tsuchida, Hachioji (JP); Yutaka Maeda, Hachioji (JP); Kazuyuki Iwasa, Hachioji (JP); Tatsuo Takanashi, Hachioji (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 11/110,155

(22) Filed: Apr. 20, 2005

(65) Prior Publication Data

US 2005/0185951 A1    Aug. 25, 2005

Related U.S. Application Data

(62) Division of application No. 10/448,335, filed on May 29, 2003, now Pat. No. 6,904,236.

(30) Foreign Application Priority Data

| | | |
|---|---|---|
| Jun. 3, 2002 | (JP) | 2002-161902 |
| Jun. 3, 2002 | (JP) | 2002-161903 |
| Jun. 10, 2002 | (JP) | 2002-169003 |
| Jun. 12, 2002 | (JP) | 2002-171623 |
| Jun. 19, 2002 | (JP) | 2002-178965 |

(51) Int. Cl.
*G03B 17/00* (2006.01)
*H01R 12/00* (2006.01)

(52) U.S. Cl. ................. 396/542; 439/65

(58) Field of Classification Search ............... 396/532, 396/535, 541, 542; 361/733, 803; 439/65
See application file for complete search history.

(56) References Cited

U.S. PATENT DOCUMENTS 2,958,013 A * 10/1960 Ansley ............... 361/736

(Continued)

FOREIGN PATENT DOCUMENTS

JP    2-111127    9/1990

(Continued)

OTHER PUBLICATIONS

Japanese Office Action for Application No. 2002-161902 JP, Mailed Nov. 7, 2006, 3 pgs.

(Continued)

*Primary Examiner*—Christopher Mahoney
(74) *Attorney, Agent, or Firm*—Straub and Pokotylo; John C. Pokotylo

(57) ABSTRACT

In a camera according to the present invention, an edge portion of a lens barrel unit is projected and arranged from a front cover. The lens barrel unit is covered with a front cover cylindrical member connected to the front cover, and a front exposed portion of the front cover cylindrical member is covered with an exterior cylindrical member as a detachable (before-attaching) metal cylindrical member. The exterior cylindrical member is positioned and is fixed by an stop claw on the front-cover side. A C-shaped stop portion cover having flexibility is made flexible and is attached around the stop claw portion, and is fixed by a screw. The restriction on design is reduced on the appearance for covering the lens barrel unit of the camera, and a camera exterior portion can be made of metal.

26 Claims, 28 Drawing Sheets

U.S. PATENT DOCUMENTS

| | | | | |
|---|---|---|---|---|
| 4,513,064 A | * | 4/1985 | Marcus | 428/582 |
| 4,833,568 A | * | 5/1989 | Berhold | 361/690 |
| 4,990,948 A | * | 2/1991 | Sasaki et al. | 396/542 |
| 5,204,806 A | * | 4/1993 | Sasaki et al. | 361/749 |
| 5,586,004 A | * | 12/1996 | Green et al. | 361/699 |

FOREIGN PATENT DOCUMENTS

| | | |
|---|---|---|
| JP | 07-020549 | 1/1995 |
| JP | 07-294790 | 11/1995 |
| JP | 10-082937 | 3/1998 |
| JP | 10-161211 | 6/1998 |
| JP | 11-007058 | 1/1999 |
| JP | 11-142917 | 5/1999 |
| JP | 2000-122132 | 4/2000 |
| JP | 2001-042192 | 2/2001 |

OTHER PUBLICATIONS

Japanese Office Action for Application No. 2002-161903 JP, Mailed Oct. 17, 2006, 2 pgs.

* cited by examiner (CLOSED STATE)

(OPENED STATE)

CAMERA AND PHOTOGRAPHING LENS BARREL

This application is a divisional of prior application Ser. No. 10/448,335 filed on May 29, 2003, which claims benefit of Japanese Applications No. 2002-161903 filed in Japan on Jun. 3, 2002, No. 2002-161902 filed in Japan on Jun. 3, 2002, No. 2002-169003 filed in Japan on Jun. 10, 2002, No. 2002-171623 filed in Japan on Jun. 12, 2002, No. 2002-178965 filed in Japan on Jun. 19, 2002, the contents of which are incorporated by this reference.

BACKGROUND OF THE INVENTION

1. Field of the Invention

The present invention relates to an exterior structure around a photographing lens barrel portion in a camera, a lens barrel and a method for assembling the lens barrel, and a mounting structure of a printed-circuit board incorporated in an electric device of the camera.

2. Related Art Statement

Japanese Unexamined Patent Application Publication No. 7-20549 discloses a conventional camera body supporting structure of a camera, having the structure of a camera body formed by attaching a front-plate unit, a shutter unit, and a main body unit to a plate unit from a rear-surface side and by attaching a lens barrel unit from a front-surface side. In the above-mentioned camera, a rear cover as an exterior member is attached to the camera body from the rear-surface side and, further, a cover unit is attached from the front-surface side.

However, a barrel cover portion in the cover unit in the camera disclosed in Japanese Unexamined Patent Application Publication No. 7-20549 needs a taper for pulling out a mold and, when the length of the lens barrel unit is long, the base portion of the barrel cover portion in the cover unit is made thick, thereby causing the limitation on design.

Then, by adopting an exterior structure for inserting a metal cylindrical member into the barrel cover portion with the taper for pulling out the mold, a space is generated at the edge of the metal cylindrical member, the attachment is difficult, and the diameter of the metal cylindrical member is increased. Although the barrel cover portion without the taper for pulling out the mold can be produced, unpreferably, the molding is complicated and a parting line is generated on the surface.

Further, upon attaching the metal cylindrical member, unpreferably on design, a fixed portion is exposed. Furthermore, upon attaching no metal cylindrical member, the management of parts is complicated because the cover unit having a model name must be exchanged in association with the change in assembled camera model.

In a conventional method for adjusting a lens of a lens barrel having a plurality of lens groups, the blur phenomenon on the periphery is suppressed by reducing an optical eccentricity among the lens groups (center deviation of the lens groups) when the spot adjustment (lens center adjustment) between the plurality of lenses are adjusted by a center adjusting device. Further, advantageously, the MTF performance with the telecentricity as center is improved.

On the other hand, when the spot adjustment between the lens groups is not performed, the center matching is executed by an assembling tool. However, in this case, only the center is adjusted between holding frames for holding the lens groups but the optical center matching of the lens groups is not executed. Therefore, the optical performance is not sufficiently obtained.

Upon adopting the method for adjusting the lenses by the spot adjustment among the lens groups using the conventional center adjusting device, the spot adjustment is performed between a pair of lens groups arranged to individual frame members (holding frame and lens-group frame) and, thereafter, the lens groups are fixed to the holding frames by an adhesive. In assembling processing after that, the combination of the pair of lens groups must be controlled so as to prevent the change thereof. Further, the control operation is troublesome because the combination of the lens groups is not visually identified.

Recent cameras require the high quality and the reduction in size. Therefore, on camera design, a method for reducing the size is utilized by enclosing parts such as a printed-circuit board by the effective use of a dead space.

Japanese Unexamined Patent Application Publication No. 7-294790 discloses one of the above-mentioned mounting structures of the printed-circuit board. That is, referring to FIGS. 38A and 38B, in the mounting structure disclosed in Japanese Unexamined Patent Application Publication No. 7-294790, six printed-circuit boards $151a$ to $151f$ are combined hexagonally. The six hexagonally combined printed-circuit boards $151a$ to $151f$ are accommodated and arranged in a space portion $152a$ as a ring shaped dead space formed in a lens barrel 152.

However, the conventional mounting structure of the printed-circuit boards $151a$ to $151f$ are not sufficient in views of a mounting area (planar area) for mounting an electric part and the small size of the arrangement space (space portion) $152a$ needs to be ensured and the large mounting area is further required. In particular, the recent variation of camera specifications causes the addition of functions using an electronic device and, consequently, the camera has a pressing problem that the reduction in size of camera body is assured and the mounting area (planar area) of the printed-circuit boards can be increased.

The above-mentioned situations apply not only to the camera but also to various electric devices including optical devices having the printed-circuit board.

The conventional electric devices have a problem that the increase in mounting area of the printed-circuit boards results in the growing in size thereof.

Further, a cam groove diagonal to the optical axis is formed to a cylindrical frame member as means for controlling the linear movement of the frame member, and a cam follower is slidably engaged with the cam groove, thus linearly moving the frame member. In a barrel device using the cam groove, the frame member is molded by using a molding tool and, consequently, the manufacturing is inexpensive in costs.

In the conventional barrel device, the cam groove of the frame member is formed by inclining the opening of the cam groove of the frame member at a predetermined angle so as to prevent an under-position thereof, in consideration of pulling out a projecting portion of the mold from the cam groove. Thus, the mold is pulled out from the product.

There is a danger that the cam follower drops off from the cam groove by applying unnecessary external force such as shock or fall in the assembling state in which the cam follower is slidably inserted in the cam groove of the frame member.

SUMMARY OF THE INVENTION

In order to solve the above-mentioned problems, it is one feature of the present invention to provide a camera which enables the reduction in limitations on appearance design of a portion for covering the periphery of a lens barrel portion therein and further enables a metal exterior portion.

Further, it is another feature of the present invention to provide a camera which enables a metal material of an exterior portion for covering the periphery of a lens barrel therein, the reduction in restriction on design around a stop portion of a metal exterior member, and easy assembling processing and management of parts.

Furthermore, it is another feature of the present invention to provide a lens barrel and a method for assembling the lens barrel, which facilitate the management for the combination of a plurality of frame members for holding a plurality of lens groups.

In addition, it is another feature of the present invention to provide an electronic device which realizes the enlargement in mounting area of printed-circuit boards and the improvement in degree of freedom on design of the printed-circuit boards.

In addition, it is another feature of the present invention to provide a barrel apparatus which realizes prevention of the pulling-out of a cam follower with a simple structure.

According to one aspect of the present invention, one camera having a photographing lens barrel, comprises: a first member for covering the barrel outer-periphery of the photographing lens barrel; a second member fitting onto the outer-periphery of the first member and covering a part of the exterior of the camera; and a third member made of a metal material, fitting onto the outer periphery of the first member and covering the outer periphery of the first member. The third member covers the outer periphery of the first member which covers the photographing lens barrel and which fits into and is attached to the second member.

According to another aspect of the present invention, a camera having an exterior portion thereof assembled backward and forward of a photographing optical axis, comprises: a first member having a cylindrical shape covering a lens barrel portion; a second member which is substantially box-shaped, for covering the front side of a camera main body; and a third member made of a metal material, for being fit into the first member, wherein the exterior portion in front of the camera is formed by connecting the first member, the second member, and the third member.

According to another aspect of the present invention, a camera having a cylindrical exterior portion covering a barrel portion incorporating a photographing lens, comprises: a first cylindrical member which forms the exterior portion and is made of a metal material; a second cylindrical member, as a member covering the barrel portion, which fits into the inner periphery of the first cylindrical member and has a stop portion for stopping the cylindrical member; and a cover member which can be detachably attached to the second cylindrical member and covers the stop portion in an attaching state. The stop portion is covered with the cover member.

According to another aspect of the present invention, a lens barrel comprises: a first frame member; a second frame member; and an engaging unit which prevents an apart state of the first frame member and the second frame member in the optical axis direction by engaging the first frame member and the second frame member with each other before the lens barrel is completed. The detachment of the first frame member and the second frame member is prevented by engaging the first frame member and the second frame member by using the engaging unit.

According to anther aspect of the present invention, an assembling method of a lens barrel having a first lens, a first frame member holding the first lens, a second lens, a second frame member holding the second lens, and an engaging unit engaging the first frame member with the second frame member, comprises the steps of: fixing the second lens to the second frame member upon assembling the first lens to the first frame member; attaching, after the assembling, the first frame member and the second frame member to a center adjusting device; center-adjusting, by the center adjusting device, the first lens so as to center-match the first lens to the second lens; and connecting, after completing the center adjustment, the first frame member to the second frame member by the engaging unit.

According to another aspect of the present invention, an assembling method of a lens barrel having a first lens, a first frame member holding the first lens, a second lens, a second frame member holding the second lens, and an engaging unit engaging the first frame member with the second frame member, comprises the steps of: relatively center-adjusting the first lens and the second lens; and engaging, after the center adjustment, the first frame member with the second frame member by the engaging unit.

According to another aspect of the present invention, in an electronic device having a ring shaped space, the ring shaped space has a plurality of printed-circuit boards which are arranged by combining crossed planes thereof.

With the above-mentioned structure, the planes of the plurality of printed-circuit boards are crossed and combined and, thus, the ring shaped space is effectively used and the areas of the planes of the printed-circuit boards are increased. Therefore, the size is reduced and the mounting areas of the printed-circuit boards are enlarged.

According to another aspect of the present invention, in an electronic device, a plurality of printed-circuit boards are combined and are arranged to have normal vectors which are non-orthogonal to the central axis of the ring shaped space.

With the above-mentioned structure, the planes of the plurality of printed-circuit boards are crossed and the normals of the planes are combined and are arranged to be non-orthogonal to the central axis. The ring shaped space is effectively used and the areas of the planes of the printed-circuit boards are increased. Therefore, the size is reduced and the mounting areas of the printed-circuit boards are enlarged.

According to another aspect of the present invention, an electronic device having a ring shaped space, comprises a printed-circuit board which is arranged so that a normal of a plane thereof in the ring shaped space is non-orthogonal to the central axis of the ring shaped space.

With the above-mentioned structure, the normal of the plane of the printed-circuit board is non-orthogonal to the central axis. The ring shaped space is effectively used and the area of the plane of the printed-circuit board is increased. Therefore, the size is reduced and the mounting areas of the printed-circuit boards are enlarged.

According to another aspect of the present invention, a barrel device comprises a frame member comprising a cam groove having a bottom portion with a predetermined width comprising a pair of first inclined planes facing each other and having inclinations to increase widths thereof toward a peripheral surface from the bottom portion, and a second inclined plane continuously formed from one of the pair of first inclined planes, having an inclination in an inner direction of the width.

With the above-mentioned structure, a taper surface of the cam follower substantially conically and trapezoidally shaped is slidably touched and is moved to the first inclined planes of a cam groove in the frame member. Unnecessary external force is applied to the cam follower, then, a large diameter portion of the cam follower is restricted by the second inclined plane, and the drop-off of the cam follower is prevented. The drop-off of the cam follower due to the unnecessary external force is effectively prevented.

According to another aspect of the present invention, a barrel device comprises: a first frame member comprising a cam groove having a bottom portion with a predetermined width, comprising a pair of first inclined planes facing each other and having inclinations to increase widths thereof toward a peripheral surface from the bottom portion, and a second inclined plane continuously formed from one of the pair of first inclined planes, having an inclination in an inner direction of the width; and a second frame member comprising a cam follower comprising a taper which has the maximum diameter in the cam groove and which is engaged with and is slidably touched to the first inclined planes.

With the above-mentioned structure, the taper surface of the cam follower of the second frame member is slidably touched and is moved to the first inclined planes of the cam groove of the first frame member and, then, the first frame member and the second frame member are relatively moved. Unnecessary external force is applied to the cam follower, then, a large diameter portion of the cam follower is restricted by the second inclined plane, and the drop-off of the cam follower is prevented. The drop-off of the cam follower due to the unnecessary external force is effectively prevented.

According to another aspect of the present invention, a barrel device comprises a frame member comprising a cam groove having a bottom portion with a predetermined width comprising a pair of first inclined planes facing each other and having inclinations to increase widths thereof toward a peripheral surface from the bottom portion, and a second inclined plane continuously formed from one of the pair of first inclined planes having an inclination different from the inclination of the first inclined plane.

With the above-mentioned structure, a taper surface of the cam follower substantially conically and trapezoidally shaped is slidably touched and is moved to the first inclined planes of a cam groove in the frame member. Unnecessary external force is applied to the cam follower, then, a large diameter portion of the cam follower is restricted by the second inclined plane, and the drop-off of the cam follower is prevented. The drop-off of the cam follower due to the unnecessary external force is effectively prevented.

These features and advantages of the present invention will become further apparent from the following detailed explanation.

DESCRIPTION OF THE PREFERRED EMBODIMENTS

Hereinbelow, a description is given of embodiments of the present invention with reference to the drawings.

Figure 1:
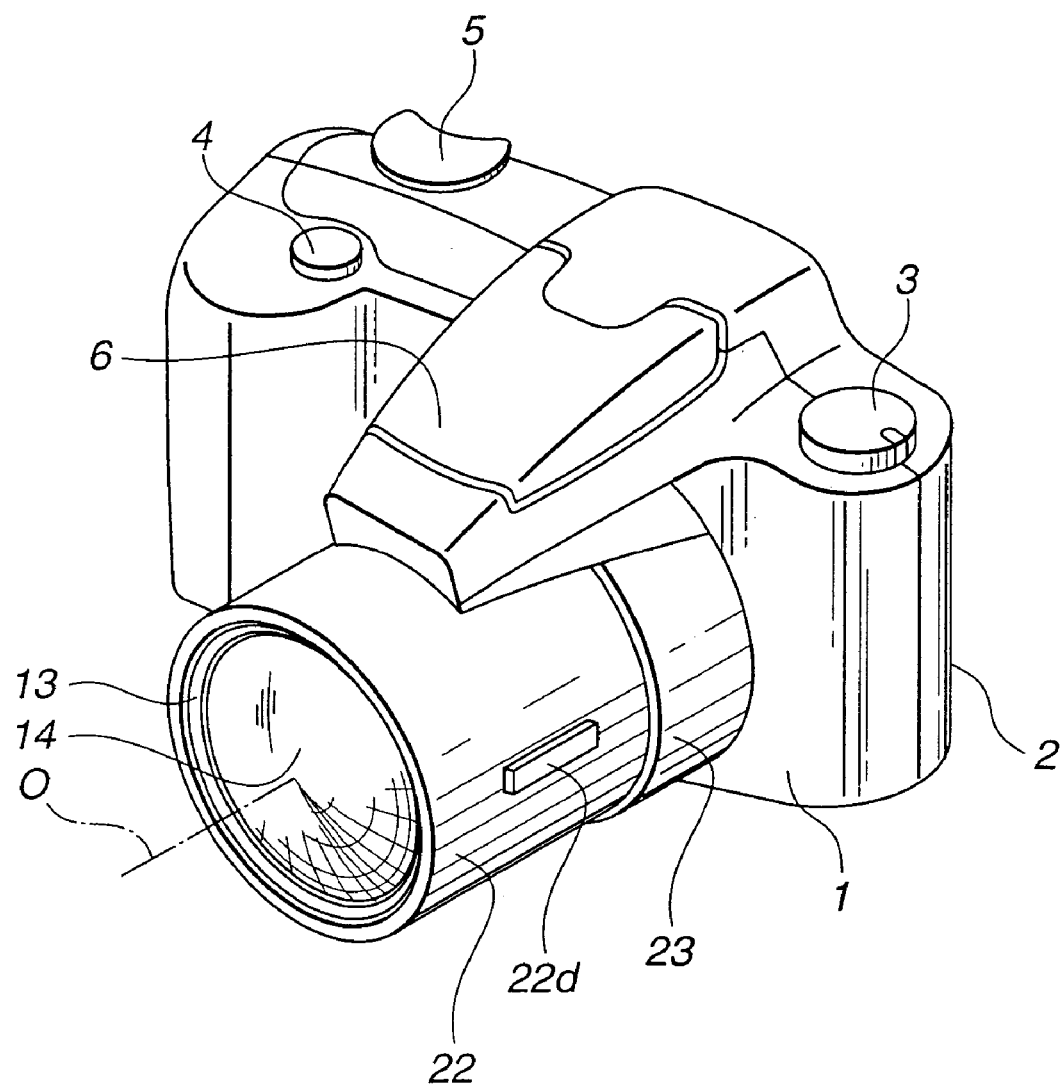
FIG. 1 is an externally perspective view showing a camera according to a first embodiment of the present invention.
Figure 2:
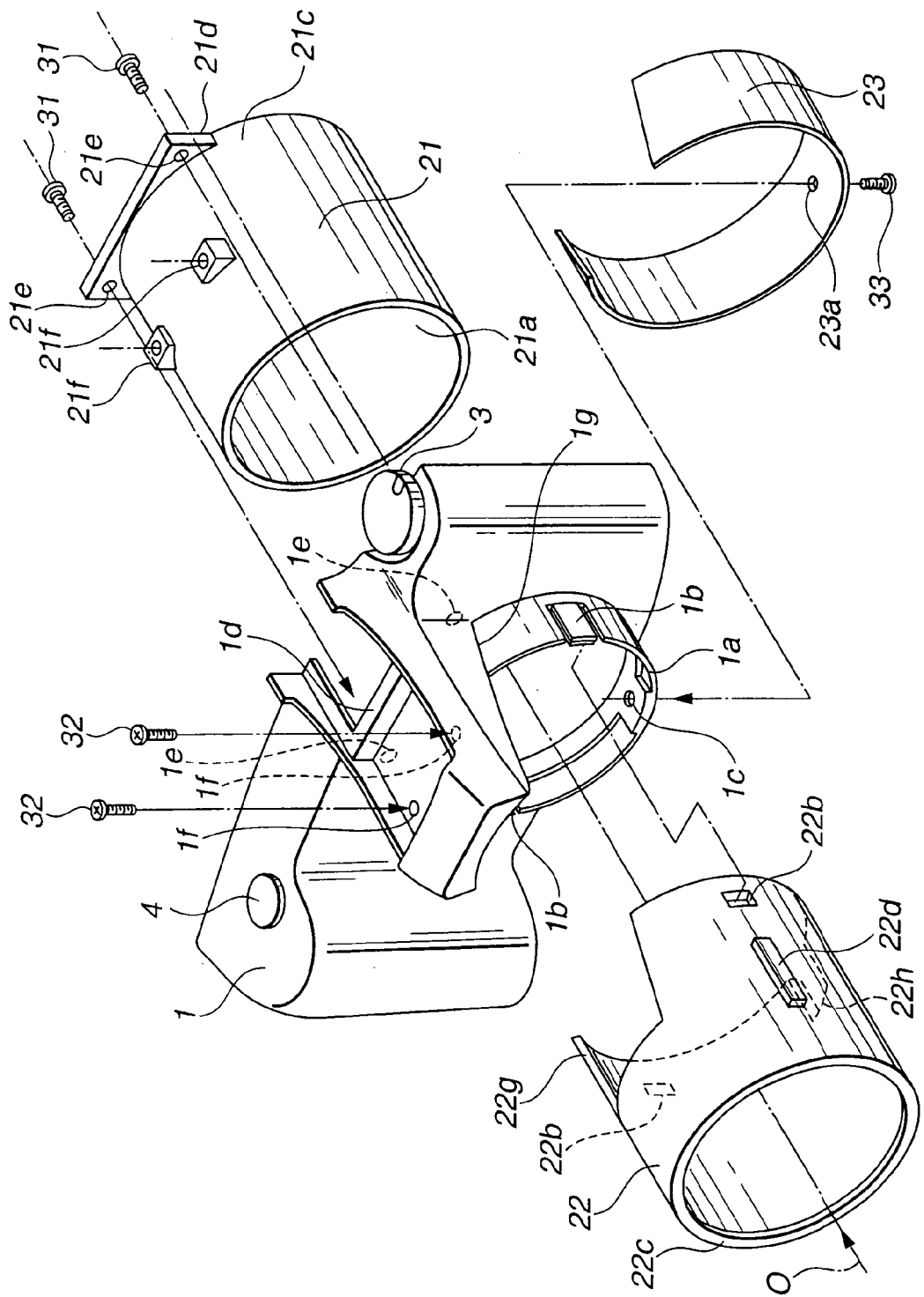
FIG. 2 is an exploded perspective view of an exterior portion around, particularly, a lens barrel unit of the camera shown in FIG. 1.
Figure 3:
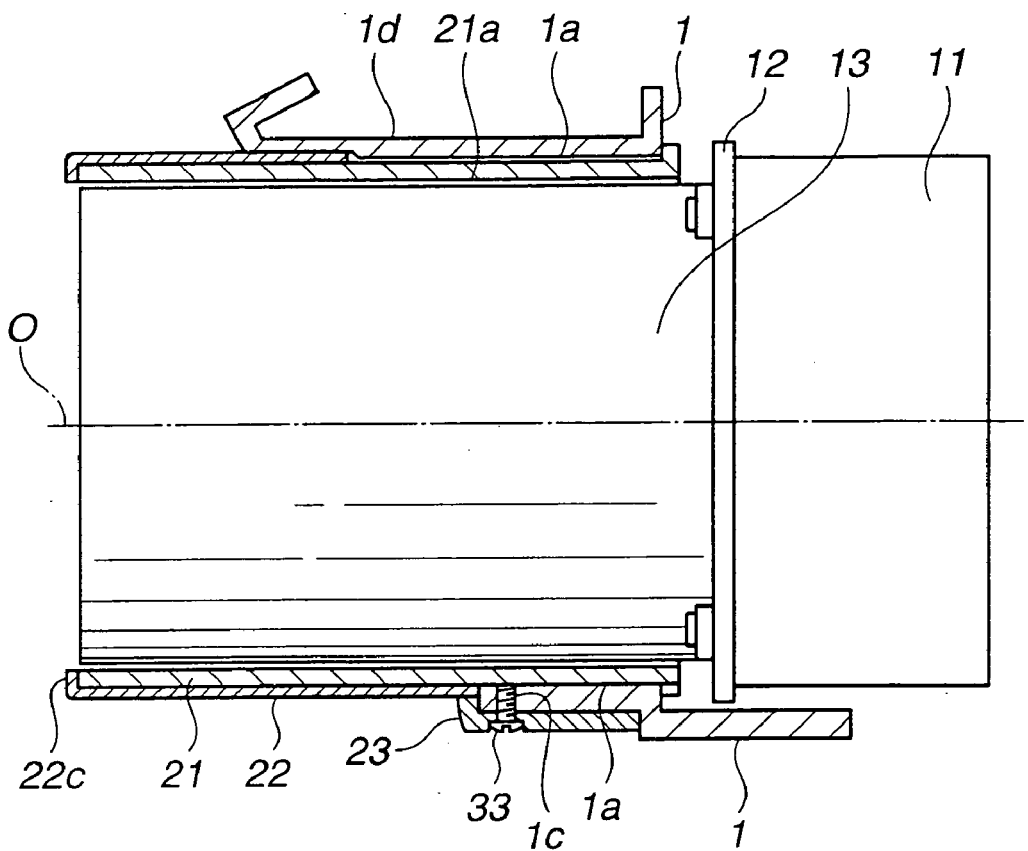
FIG. 3 is a longitudinal cross-sectional view around the lens barrel unit of the camera shown in FIG. 1.
Figure 4:
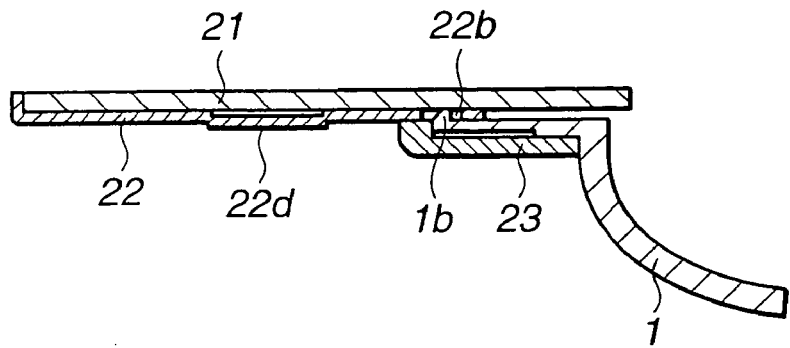
FIG. 4 is a horizontally cross-sectional view around the lens barrel unit of the camera shown in FIG. 1.

FIG. 1 is a an externally perspective view showing a camera according to a first embodiment of the present invention. FIG. 2 is an exploded perspective view showing an exterior portion around a lens barrel unit of the camera. FIG. 3 is a longitudinal cross-sectional view around the lens barrel unit of the camera. FIG. 4 is a horizontally cross-sectional view around the lens barrel unit of the camera. In the following description, a subject side of the camera is in front and an image forming side is in the back.

Referring to FIG. 1, an exterior portion of the camera according to the first embodiment comprises: a front cover 1 and a rear cover 2, as members for covering a camera main body unit 11 (refer to FIG. 3) and as second members (second cylindrical members); an exterior cylindrical member 22 made of metal as a third member (first cylindrical member); and a stop-portion cover 23 as a cover member.

The front cover 1 comprises: a release button 3; a pop-up strobe light emitting portion 6; and a power switch button 3, at the top thereof. Further, an exterior cylindrical member 22 and a stop-portion cover 23 are attached to the front portion of the front cover 1.

The rear cover 2 comprises a zoom lever 5. The front cover 1 and the rear cover 2 are abutted onto and are assembled to the camera main body unit 11 backward and forward.

An inner-peripheral portion of the exterior cylindrical member 22 is inserted into and is fixed to a front cover cylindrical member 21 as a first member (second cylindrical member). An outer-peripheral portion of a lens barrel unit 13 (refer to FIG. 3) for holding a photographing lens 14, as will be described later, is inserted to the front cover cylindrical member 21.

Next, a description is given of the structure of the exterior portion in front of the camera which covers the lens barrel unit with reference to FIGS. 2 to 4.

The exterior portion in front of the camera comprises: the front cover 1 made of a resin material; the front cover cylindrical member 21 made of the resin member; an exterior cylindrical member 22 made of a metal-sheet pressmolding member; and the stop-portion cover 23 as a cover member made of the resin material.

The front cover 1 is a substantially box-shaped exterior member and has, in the center, a projected circular portion 1a which is projected forward. A front-projected portion 1g at the top center has a strobe accommodating portion 1d for accommodating the strobe light emitting portion 6. A claw portion 1b, as a stop portion which is elastically modified in the right and left directions, is arranged to the projected circular portion 1a.

Referring to FIGS. 2 and 3, the front cover cylindrical member 21 comprises: a flange portion 21d, as a flange-shaped connecting portion having a screw inserting hole 21e at a rear end portion of the cylindrical portion and as a straight cylindrical-shaped frame member; and a screw hole 21f at the top of the cylindrical portion. The front cover cylindrical member 21 is fixed to the front cover 1 by a screw in a state in which it is inserted in the projected circular portion 1a of the front cover 1. That is, the screw 31 is screwed into a screw hole 1e of the front cover 1 by insertion into a screw inserting hole 21e of the flange portion 21d, and the screw 32 is screwed into a screw hole 21f of the front cover cylindrical member 21 by insertion into a screw inserting hole 1f of the front cover 1. Thus, the front cover cylindrical member 21 is tightened, is connected, and is fixed to the front cover 1. In the fixing state, the front portion of the front cover cylindrical member 21 is projected and attached in a further front direction than the projected circular portion 1a of the front cover 1.

Referring to FIG. 3, an outer-peripheral fixing frame of the lens barrel unit 13 fixed to the camera main body unit 11 through a main body plate 12 is inserted into the inner-peripheral portion 21a of the front cover cylindrical member 21 fixed to the front cover 1.

The exterior cylindrical member 22 as the straight cylindrical-shaped exterior member made of metal comprises: an inner flange portion 22c at its edge portion; a notch portion 22g for escaping the front-projected portion 1g of the front cover 1 on its rear side; a notch 22h for escaping the periphery of the screw hole 1c of the projected circular portion 1a; two stopped hole portions 22b which are stopped to the claw portion 1b of the front cover 1 at the right and left positions on the rear side; and a projected display portion 22d which is embossed at a position on the side surface.

The projected display portion 22d displays a model number of the camera, a type number, a focal distance, an F number, and the like, and is subjected to embossing toward the-outside and thereafter the surface thereof is subjected to mirror processing by using a diamond cutter.

The exterior cylindrical member 22 is inserted onto an outer-peripheral surface 21c of the front-projected portion in the front cover cylindrical member 21 fixed to the front cover 1, and an optical axis O direction and a rotating direction are positioned by stopping the claw 1b to the stopped hole 22b to hold the exterior cylindrical member 22. Further, the exterior cylindrical member 22 is finally touched to the outer-peripheral surface 21c of the front cover cylindrical member 21 so as to set a fixing state.

The stop-portion cover 23 is a C-shaped flexible (elastically modified) member having a notch portion upstream. The stop-portion cover 23 fits to the outer periphery of the projected circular portion 1a of the front cover 1 so that it covers the periphery of the claw portion 1b as an engaging portion with the exterior cylindrical member 22 of the front cover 1 and the notch portion is widened. After fitting, a plate screw 33 is inserted into the screw inserting hole 23a of the stop-portion cover 23 and is screwed to the screw hole 1c of the front cover 1, and the stop-portion cover 23 is fixed to the front cover 1.

In the camera with the above structure according to the first embodiment, the front cover cylindrical member 21 projected and arranged forward is assembled to the front cover 1 of the camera, and the front cover cylindrical member 21 accommodates the lens barrel unit 13. Further, other camera members are incorporated in the front cover cylindrical member 21, thus completely assembling the camera. In the camera assembling state, the exterior cylindrical member 22 is inserted into the front-projected portion of the front cover cylindrical member 21 from the front side, and is stopped by the claw portion 1a so as to set the attaching state. Furthermore, the stop-portion cover 23 fits and attaches to the periphery of the stop portion of the exterior cylindrical member 22. In the attaching state, the front-projected portion of the front cover cylindrical member 21 is covered with the exterior cylindrical member 22 and the stop portion of the exterior cylindrical member 22 is covered with the stop-portion cover 23.

In the above camera according to the first embodiment, the front cover cylindrical member 21 may have a parting line on its surface because it is hidden therein, and it can be straight cylindrical-shaped by using side-division molding. Further, the exterior cylindrical member 22 is extremely easily formed as a straight cylindrical member and the restriction on the external design is reduced because it is made of a circular press-processing product made of metal. The stop-portion cover 23 is attached by making the stop-portion cover 23 flexible and therefore the shape of the stop-portion cover 23 is simple and the assembling operation is easy.

Since the exterior cylindrical member 22 is attached in a final assembling state after the members of the camera are incorporated. Therefore, the exterior cylindrical member 22 having the projected display portion 22d corresponding to the camera type or specification is selected and attached. Thus, a plurality of the exterior cylindrical members 22 having the corresponding projected display portions may be provided upon manufacturing many models and the inventory management is simplified.

Further, in a state before adhering the exterior cylindrical member 22, the screw is removed and the stop-portion cover 23 is detached. Then, the exterior cylindrical member 22 is easily exchanged. In addition, the maintenance and exchange after the completion of manufacturing the camera are easily performed by using any exfoliative adhesive or by fixing only the claw portion and the screw portion without any adhesive.

The front cover cylindrical member 21 can integrally be molded with the front cover 1. In this case, the integral portion of the front cover cylindrical member with the front cover 1 is covered with the exterior cylindrical member 22 and therefore if a parting line for molding exists on the surface, there is no problem. The integral portion can be straight and cylindrically shaped. The number of parts and the number of assembling processing are reduced.

As mentioned above, according to the first embodiment, the exterior portion for covering the lens barrel portion in the camera has the reduced number of restriction on design and the exterior portion of the camera can be made of metal. Further, it is possible to provide the camera in which the number of restrictions on design is reduced and the assembling is simplified by applying the cover member for covering the stop portion of the cylindrical member as an exterior metal member.

Next, a description is given of a lens barrel according to a second embodiment of the present invention.

Figure 5:
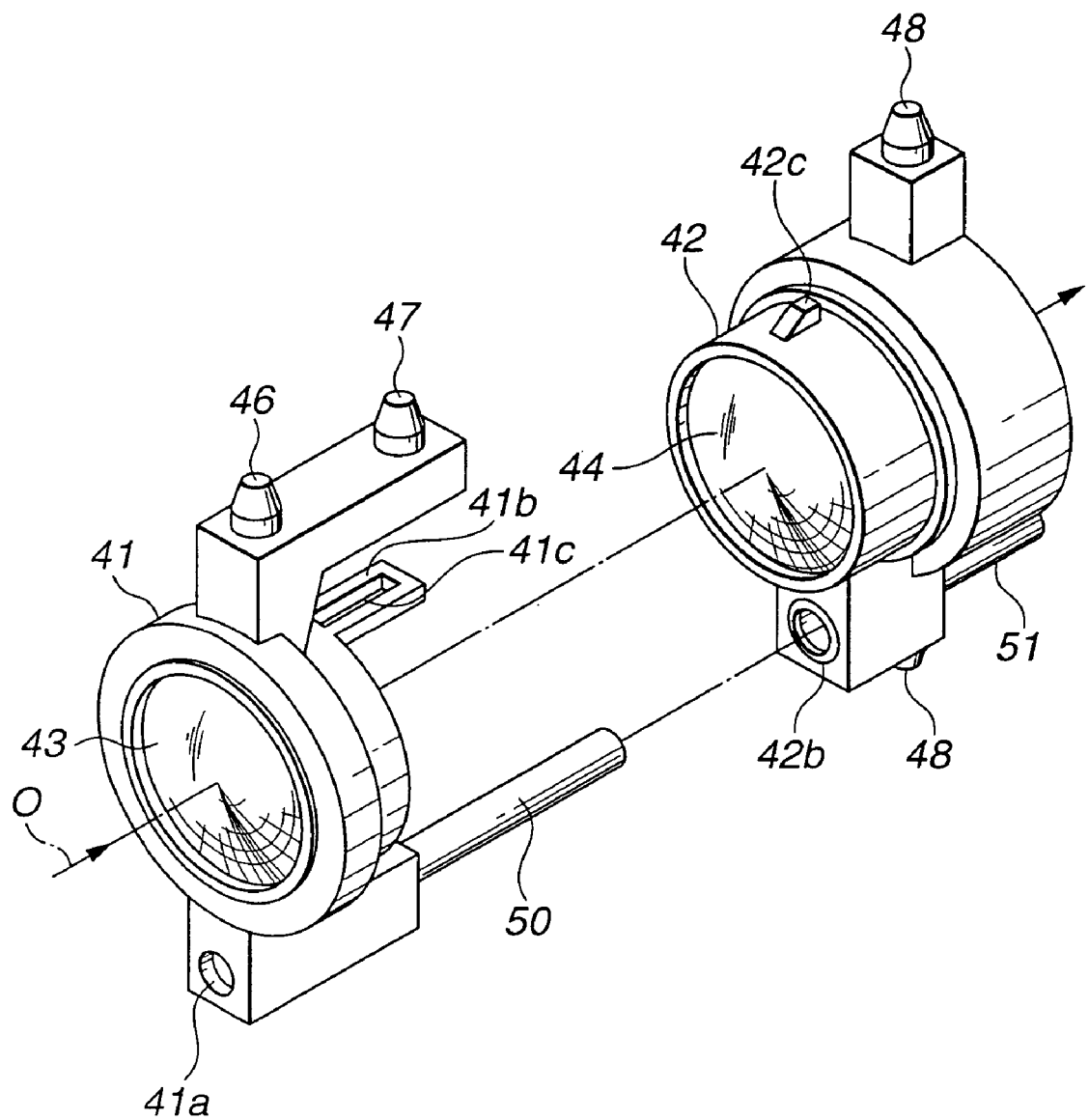
FIG. 5 is an exploded perspective view showing two lens-group frames incorporated in a lens barrel according to a second embodiment of the present invention.
Figure 6:
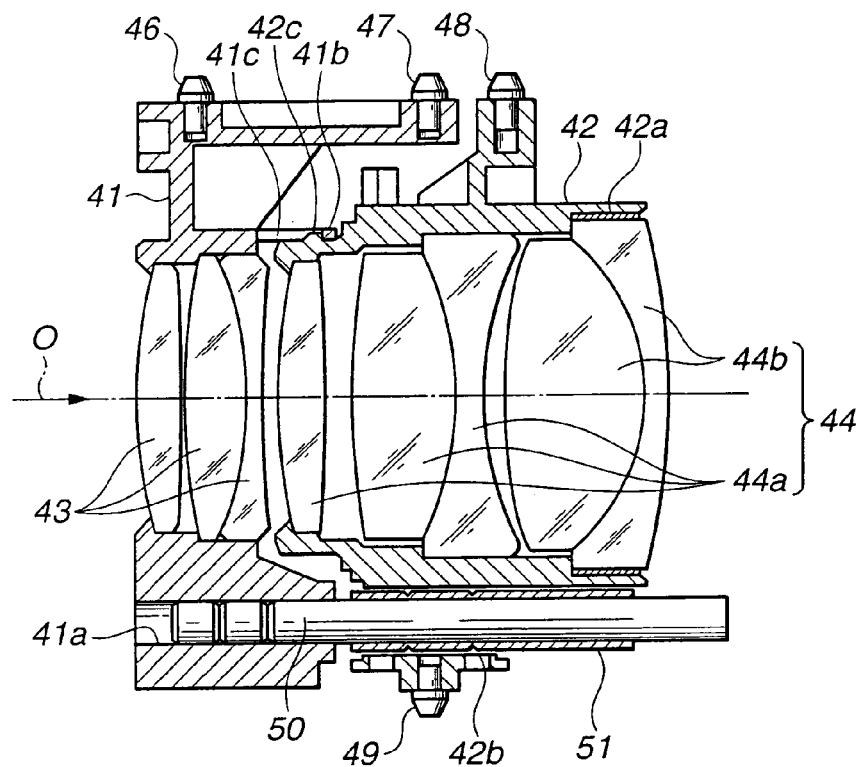
FIG. 6 is a longitudinal cross-sectional view when the two lens-group frames shown in FIG. 5 are engaged with each other.
Figure 7:
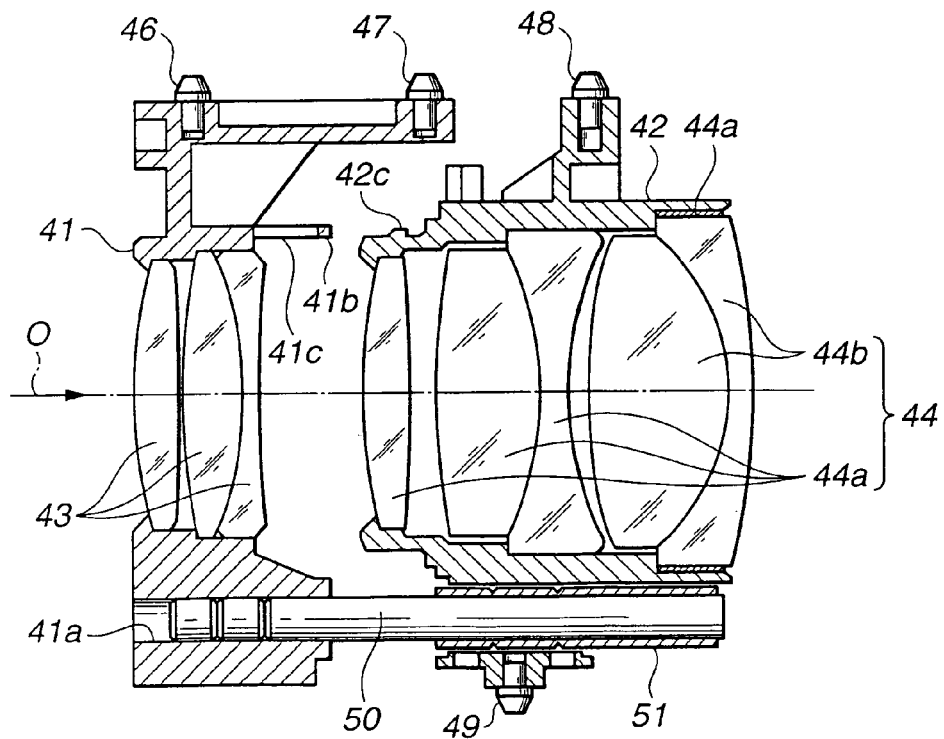
FIG. 7 is a longitudinal cross-sectional view when the two lens-group frames shown in FIG. 5 incorporated in the lens barrel are set apart from each other therein.

FIG. 5 is an exploded perspective view showing two lens-group frames incorporated in the lens barrel according to the second embodiment. FIG. 6 is a longitudinal cross-sectional view when the two lens-group frames are engaged with each other. FIG. 7 is a longitudinal cross-sectional view when the two lens-group frames incorporated in the lens barrel are set apart from each other.

The lens barrel according to the second embodiment comprises four groups of lenses. Referring to FIG. 5, the lens barrel includes a third-group frame 41 as a first frame member which advances and returns upon zooming, a fourth-group frame 42 as a second frame member, and a first-group frame and a second-group frame (not shown).

The third-group frame 41 has a guide shaft hole 41a at the bottom of the frame, two cam followers 46 and 47 fixed at the top of the frame, and an engaging piece 41b having a claw engaging hole 41c as engaging means projected to the outer-peripheral portion in the back of the frame. A guide shaft 50 in parallel with the optical axis O is inserted, is adhered, and is fixed to the guide shaft hole 41a. The engaging piece 41b is made of a thin plate and is flexible and is elastically modified above and below.

Third-group lenses 43 as first lenses are inserted in, are adhered to, and are fixed to an inner-peripheral portion of the frame of the third-group frame 41.

The fourth-group frame 42 has a sleeve hole 42b at the bottom of the frame. Further, cam followers 48 and 49 are fixed to the top and the bottom of the frame and a claw 42c as engaging means is arranged to a front portion of the outer periphery of the frame. A sleeve 51 is inserted with play in the sleeve hole 42b in an engaging state, is positioned while it is inserted, is adhered, and is fixed to the guide shaft 50. The claw 42c is inserted into a claw engaging hole 41c of the third-group frame 41, and has an inclined plane for pressing up the claw engaging piece 41b of the third-group frame 41 upon insertion at the front portion thereof.

Fourth-group lenses 44 as second lenses having a fourth-group front lens 44a and a fourth-group rear lens 44b are fixed to the inner-peripheral portion of the fourth-group frame 42. The fourth-group front lens 44a is inserted, is adhered, and is fixed without position adjustment. However, the fourth-group rear lens 44b is inserted with play in a lens inserting portion 42a, is positioned with lens center adjustment using the lens center adjusting device, as will be described later, is adhered, and is fixed.

Further, the fourth-group rear lens 44b may be inserted, be adhered, and be fixed without the position adjustment similarly to the fourth-group front lens 44a, relational positions of the sleeve 51 and the fourth-group frame 42 may be positioned with the position adjustment using the lens center adjusting device, be adhered, and be fixed. In this case, the claw engaging hole 41c and the claw 42c have play corresponding to the adjustment.

Upon the lens center adjustment of the third-group frame 41 and the fourth-group frame 42, the third-group frame 41 to which the third-group lenses 43 are fixed and the fourth-group frame 42 to which the fourth-group front lens 44a is fixed are attached to a laser lens center adjusting device. The guide shaft 50 is fit into the sleeve 51 and the third-group frame 41 and the fourth-group frame 42 are held in a relatively positioned state. The fourth-group rear lens 44b is inserted with play in the lens inserting portion 42a of the fourth-group frame 42.

Then, the position is adjusted by deviating the position of the fourth-group rear lens 44b so as to reduce the eccentricity of the spots between the third-group lens 43 and the fourth-group lens 44 while observing the spots of the laser beams. That is, the relational position between the first lenses and the second lenses is adjusted. In the adjusting state, the fourth-group rear lens 45 is adhered and is fixed to the lens inserting portion 42a. The lens center adjustment may be performed by deviating not the fourth-group lens 44 but the third-group lens 43.

Referring to FIG. 6, in the third-group frame 41 and the fourth-group frame 42 having the adjusted lens center, the front portion of the frame faces the rear portion, and the claw 42c of the fourth-group frame 42 is inserted in the claw engaging hole 41c of the engaging piece 41b of the third-group frame 41 so as to set the engaging state. At that time, the guide shaft 50 is further inserted in the sleeve 51. The third-group frame 41 and the fourth-group frame 42 in the engaging state are adjacently held so as to prevent easy detachment, as compared with the apart state of the frames upon assembling the lens barrel (completing the manufacturing) as shown in FIG. 7.

The lens center adjustment may be performed in the adjacently holding state having a shorter distance between the lens frames, as compared with the apart state having the distance therebetween upon assembling the lens barrel as shown in FIG. 7.

The third-group frame 41 and the fourth-group frame 42 hold the state of engagement with each other during the conveying or housing operation until the frames are assembled in the lens barrel. Upon assembling the frames in the lens barrel, the engaging piece 41b is caught up and the claw 42c is detached from the claw engaging hole 41c. In views of the apart positional relationship between the third-group frame 41 and the fourth-group frame 42, the distance therebetween during using the lens barrel as the photographing lens or the shortest apart distance at the lens collapsed position is longer as compared with that in the engaging state.

With the lens barrel according to the second embodiment, the blur on the circumference is suppressed and the MTF performance having the telecentricity as center is improved because the lens centers are adjusted between the third-group lenses 43 and the fourth-group lenses 44. The combining state of the frame after the lens center adjustment is certainly held by the engaging state during the assembling and therefore no combining mistake is caused.

During assembling the third-group frame 41 and the fourth-group frame 42 in the lens barrel after the lens center adjustment, the third-group frame 41 and the fourth-group frame 42 are integrally held in a state in which the claw 42c is engaged with the claw engaging hole 41c so as to reduce a frame sharing space in the optical axis O direction as much as possible. Thus, during the conveying and housing operation upon assembling, the third-group frame 41 and the fourth-group frame 42 do not become the obstacle, and the management during assembling is easy without paying attention to the combination of the frame members.

Next, a description is given of a lens barrel according to a third embodiment of the present invention.

Figure 8:
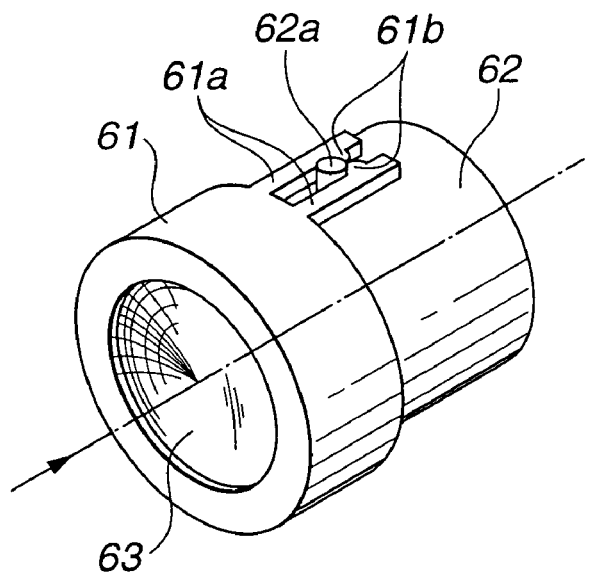
FIG. 8 is a perspective view showing an engaging state of two lens-group frames incorporated in a lens barrel according to a third embodiment of the present invention.
Figure 9:
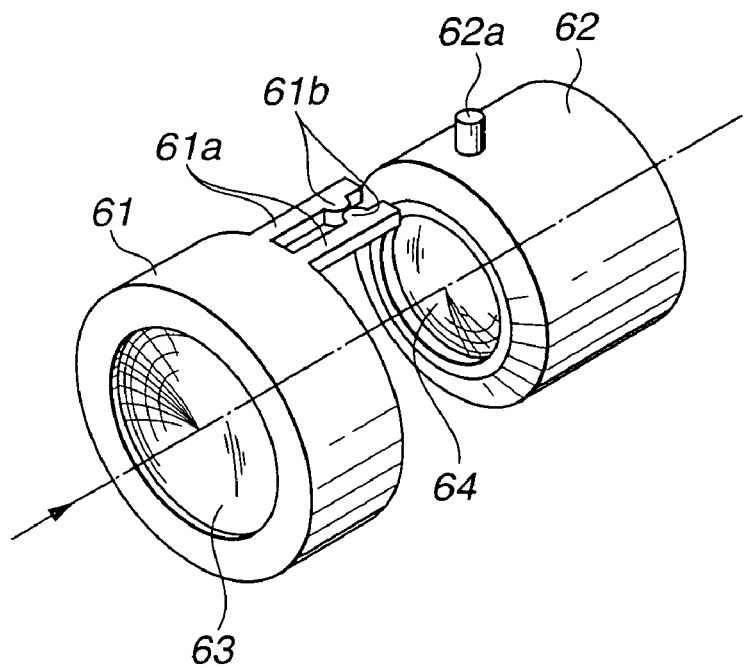
FIG. 9 is a perspective view showing an apart state of the two lens-group frames incorporated in the lens barrel shown in FIG. 8.
Figure 10:
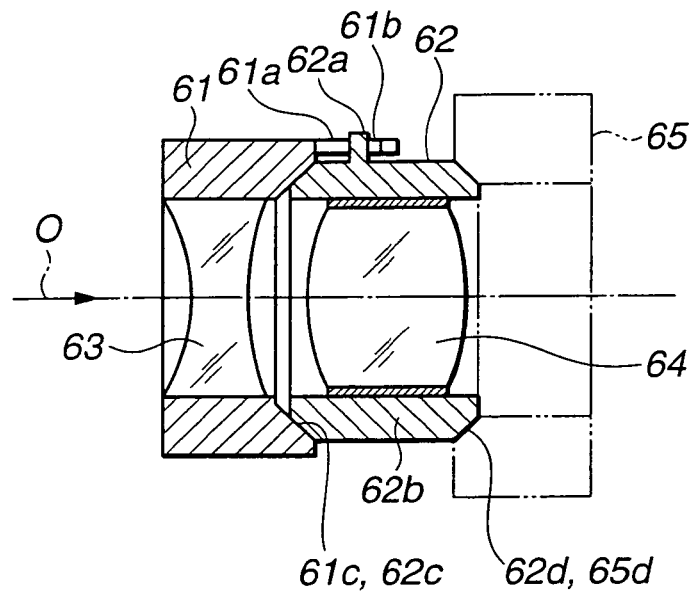
FIG. 10 is a longitudinally cross-sectional view showing a state in which the two engaged lens-group frames shown in FIG. 8 are attached to a lens center adjusting device.
Figure 11:
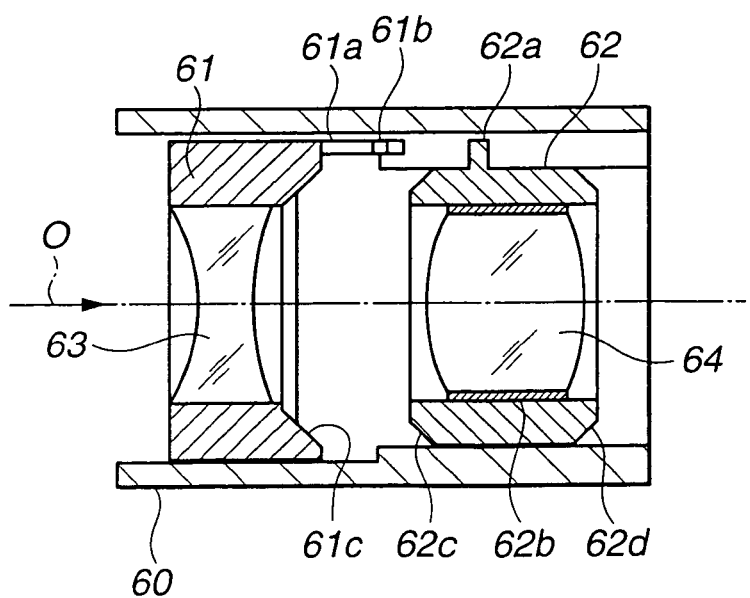
FIG. 11 is a longitudinally cross-sectional view showing a state in which the two lens-group frames shown in FIG. 8 are incorporated in the lens barrel.

FIG. 8 is a perspective view showing an engaging state of two lens-group frames incorporated in a lens barrel according to the third embodiment. FIG. 9 is a perspective view showing an apart state of the two lens-group frames incorporated in the lens barrel. FIG. 10 is a longitudinally cross-sectional view showing a state in which the two engaged lens-group frames are attached to a lens center adjusting device. FIG. 11 is a longitudinally cross-sectional view showing a state in which the two lens-group frames are incorporated in the lens barrel.

Referring to FIG. 8, the lens barrel according to the third embodiment comprises four groups of lenses, and incorporates, as a photographing optical system, a third-group frame 61 as a first frame member which can advance and return, a fourth-group frame 62 as a second frame member, and a first-group frame and a second-group frame (not shown).

The third-group frame 61 has a cave taper surface 61*c* at an end surface portion in the back thereof and further includes two engaging pieces 61*a* having facing projections 61*b* as engaging means projected in the back of the outer-peripheral portion thereof. The engaging pieces 61*a* can elastically be modified in the right and left direction. Although not shown, a cam follower for advance and return is arranged to the outer-peripheral portion of the third-group frame 61.

A third-group lens 63 is inserted, is adhered, and is fixed to the inner-peripheral portion of the third-group frame 61.

The fourth-group frame 62 has a projected taper surface 62*c* and a projected taper surface 62*d* at an end surface portion in front thereof and at an end surface portion in the back thereof, respectively, and further includes a pin 62*a* as engaging means projected to the top of the outer periphery thereof. Although not shown, the outer-peripheral portion of the fourth-group frame 62 has a cam follower for advance and return. The projected taper surface 62*c* can be jointed to the cave taper surface 61*c* of the third-group frame 61, and the projected taper surface 62*d* can be jointed to a cave taper surface 65*d* of a frame supporting portion 65 in the lens center adjusting device. The pin 62*a* can be sandwiched in the projections 61*b* of the engaging pieces 61*a* in the third-group frame 61. The cave taper surface 61*c*, the projected taper surfaces 62*c* and 62*d*, and the cave taper surface 65*d* are formed along a conical plane with the optical axis O as the center.

A fourth-group lens 64 is inserted with play in a frame inner-peripheral portion 62*b* of the fourth-group frame 62, is positioned, is adhered, and is fixed by lens center adjustment using the lens center adjusting device, which will be described later.

In the lens center adjustment of the third-group frame 61 and the fourth-group frame 62, the third-group frame 61 to which the three-group lens 63 is fixed and the fourth-group frame 62 in which the four-group lens 64 is inserted with play are attached to a laser lens center adjusting device. Referring to FIG. 10, the cave taper portion 61*c* is jointed to the projected taper portion 62*c* to position the third-group frame 61 and the fourth-group frame 62. Further, the cave taper surface 65*d* of the frame supporting portion 65 in the lens center adjusting device is jointed to the projected taper portion 62*d* of the fourth-group frame 62 to position the fourth-group frame 62 to the lens center adjusting device. In the jointing state, the pin 62*a* of the fourth-group frame 62 is sandwiched in the projections 61*b* of the engaging pieces 61*a* in the third-group frame 61.

Then, the lens centers are adjusted by deviating the position of the fourth-group lens 64 so as to prevent the eccentricity in spots between the third-group lens 63 and the fourth-group lens 64 while observing the spots of laser beams. In the adjusting state, the fourth-group lens 64 is adhered and is fixed to the lens inserting portion 62*b*. The lens centers may be adjusted by deviating not the fourth-group lens 64 but the third-group lens 63.

The third-group frame 61 and the fourth-group frame 62 are held in the state in which the pin 62*a* is engaged with the projections 61*b* of the engaging pieces 61*a* as shown in FIG. 8 during the conveying or housing operation until the frames are assembled in the lens barrel. In views of the apart positional relationship between the third-group frame 61 and the fourth-group frame 62, the distance therebetween in the engaging state is shorter, that is, the frames are adjacently held, as compared with that in the state for assembling the lens barrel (state for completing the manufacturing) as shown in FIGS. 9 and 11, and the frames are not easily detached as long as the detaching operation is not performed.

When the third-group frame 61 and the fourth-group frame 62 are assembled in the lens barrel, the engagement between the pin 62*a* and the projections 61*b* of the engaging pieces 61*a* is reset. Further, the third-group frame 61 and the fourth-group frame 62 are inserted in the inner periphery of the holding frame 60 of the lens barrel.

With the lens barrel according to the third embodiment, the blur on the circumference is suppressed and the MTF performance having the telecentricity as center is improved because the lens centers are adjusted between the third-group lens 63 and the fourth-group lens 64, similarly to the lens barrel according to the second embodiment. The combining state of the frames after the lens center adjustment is certainly held by the engaging state during the assembling and therefore no combining mistake is caused.

During assembling the third-group frame 61 and the fourth-group frame 62 in the lens barrel after the lens center adjustment in progress of assembling the lens barrel, the third-group frame 61 and the fourth-group frame 62 are integrally held in a state in which the pin 62*a* is engaged with the projections 61*b* of the engaging pieces 61*a* so as to reduce a frame sharing space in the optical axis O direction as much as possible. Thus, during the conveying and housing operation upon assembling, the third-group frame 61 and the fourth-group frame 62 do not become the obstacle, and the management during assembling is easy without paying attention to the combination of the frame members.

As mentioned above, according to the third embodiment, after adjusting the two frame members incorporated in the lens barrel, the management during assembling is easy without paying attention to the combination of the frame members.

Next, a description is given of a lens barrel in a camera according to a fourth embodiment of the present invention.

Figure 12:
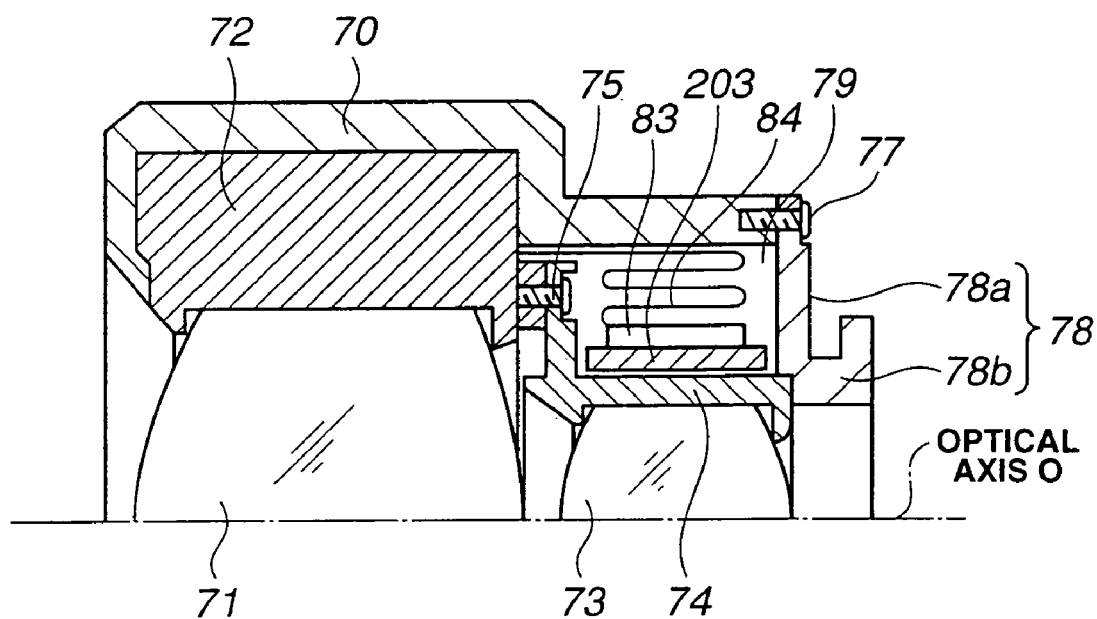
FIG. 12 is a cross-sectional view showing a main portion of a camera according to a fourth embodiment of the present invention.

FIG. 12 shows the lens barrel in the camera according to the fourth embodiment. A moving optical system 71 is attached to a cylindrical outer-casing 70 as a fixing casing via a lens driving mechanism portion 72 to freely adjust the movement thereof in the optical axis direction (central axis direction). An optical system holding casing 74 in which a fixing optical system 73 is inserted with play in the outer casing 70, and the optical system holding casing 74 is screwed and is attached by using a screw 75. In this case, the optical axes of the fixing optical system 73 and the moving optical system 71 are adjusted.

A mounting member 78 is screwed to an end portion on a camera main body of the outer casing 70 by using a screw 77. A shielding portion 78*a* and a mounting portion 78*b* are arranged to the mounting member 78, the shielding portion 78*a* shields a ring shaped (doughnut-shaped) space 79 between the outer casing 70 and the optical system holding casing 74, and the mounting portion 78*b* is attached to a lens inserting portion (body mounting member) (not shown) of the camera main body so as to attach the lens barrel to the camera main body.

Figure 13:
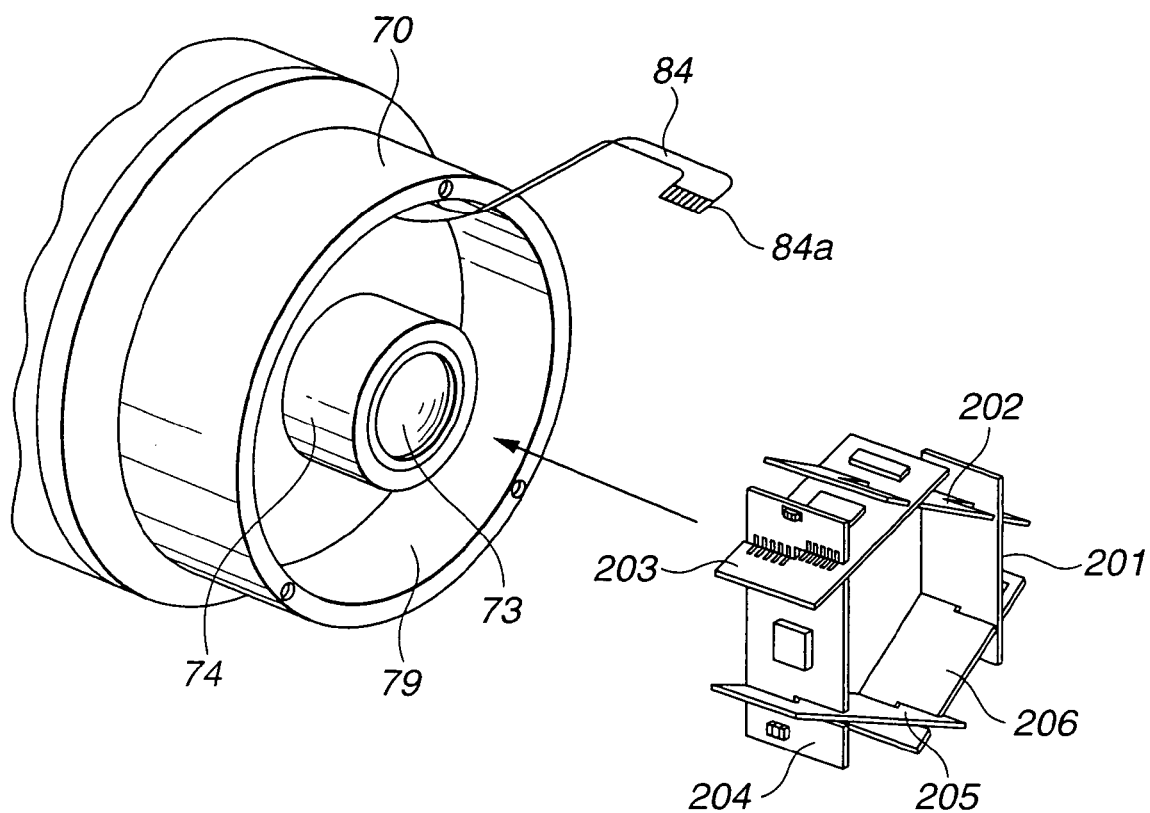
FIG. 13 is an exploded perspective view showing a state in which a space shown in FIG. 12 is apart from printed-circuit boards.

Referring to FIG. 13, the space 79 between the outer casing 70 and the optical system holding casing 74 is ring shaped to round the optical axis of the lens barrel. A plurality of, e.g., six rigid printed-circuit boards 201 to 206 forming a lens control portion, etc. are hexagonally attached and accommodated in the space 79 by crossing planes (mounting areas) thereof and surrounding the fixing optical system 73. In other words, referring to FIGS. 14 and 15, the six printed-circuit boards 201 to 206 are accommodated in the space 79 by crossing the adjacent printed-circuit boards so that an end portion of one printed-circuit board is projected from the plane of another printed-circuit board and by polygonally assembling the boards.

Figure 16:
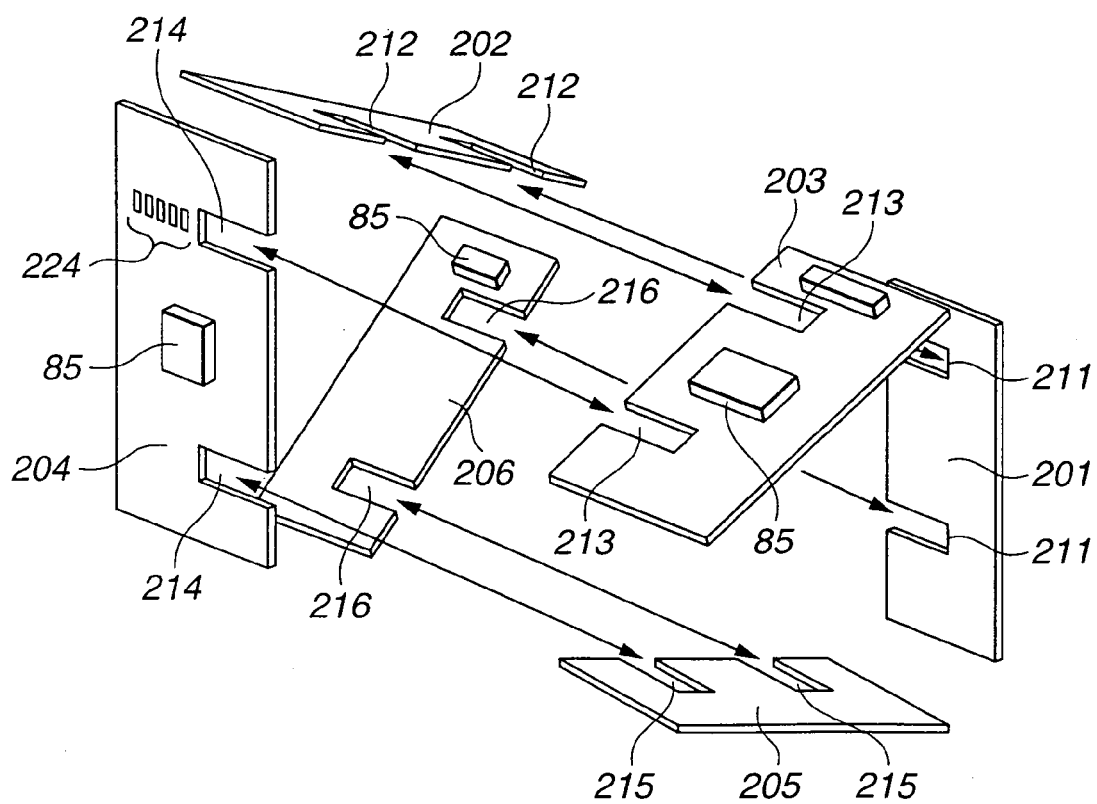
FIG. 16 is an exploded perspective view showing the printed-circuit boards shown in FIG. 15.

Referring to FIG. 16, two rectangular notch portions 211 to two rectangular notch portions 216 are arranged to one side of the printed-circuit boards 201 to 206 at a predetermined interval. The printed-circuit boards 201 to 206 are hexagonally attached by incorporating the notch portions 211 to 216. Specifically, the two notch portions 211 are fit into one of the two notch portions 216 and one of the two notch portions 212, respectively, by mutually crossing thereto. The two notch portions 213 are fit into another notch portion 212 and one of the two notch portions 214, respectively, by mutually crossing thereto. Further, the two notch portions 215 are fit into another notch portion 214 and another notch portion 216, respectively, by mutually crossing thereto. Consequently, the six printed-it circuit boards 201 to 206 are hexagonally assembled by crossing the adjacent printed-circuit boards so that the end portion of the one printed-circuit board is projected from the plane of the other printed-circuit board. The six printed-circuit boards 201 to 206 are arranged in the ring shaped space 79 in the lens barrel. Here, the six printed-circuit boards 201 to 206 have normal vectors on the planes (mounting areas) orthogonal to the optical axis (central axis).

Figure 15:
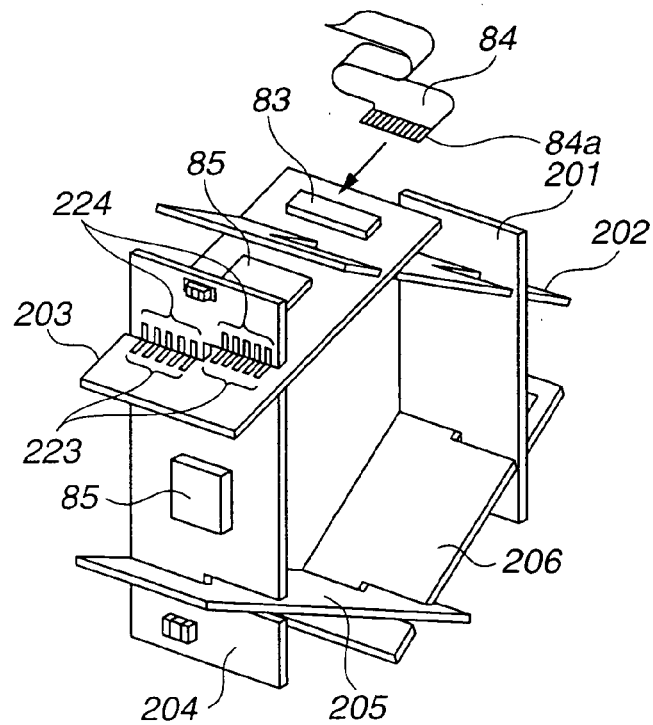
FIG. 15 is a perspective view showing a state in which the printed-circuit boards shown in FIG. 12 are hexagonally combined.

The adjacent printed-circuit boards of the six ones 201 to 206 have connecting lands 221 to 226 (refer to FIG. 15, incidentally, only a part is shown for the sake of the convenience). Thus, the notch portions 211 to 216 in the six printed-circuit boards 201 to 206 are engaged, then the connecting lands 221 to 226 become adjacent, and the six printed-circuit boards 201 to 206 are connected by soldering in the adjacent state.

The connecting lands 221 to 226 arranged to the printed-circuit boards 201 to 206 may be formed to all the boards so as to electrically connect all the boards, or the printed-circuit boards may be arranged electrically independently.

Further, an external connector 83 is provided on at least one of the six printed-circuit boards 201 to 206. Connecting terminals 84a arranged to a flexible printed-circuit board 84 connected to an actuator in the lens driving mechanism portion 72 in the lens barrel (not shown) are connected to the external connector 83, thus electrically connecting the printed-circuit boards 201 to 206 to the actuator (not shown) of the lens driving mechanism portion 72.

Referring to FIGS. 13 to 16, reference numeral 85 denotes an electronic part such as an IC.

Figure 14:
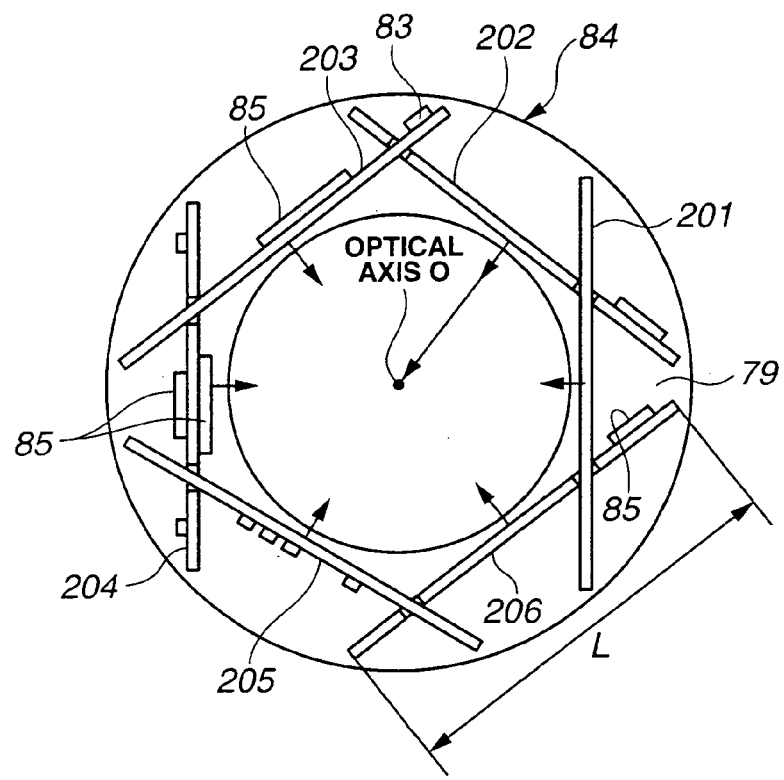
FIG. 14 is an arrangement diagram showing a state in which the printed-circuit boards shown in FIG. 12 are assembled in the space.
Figure 38A:
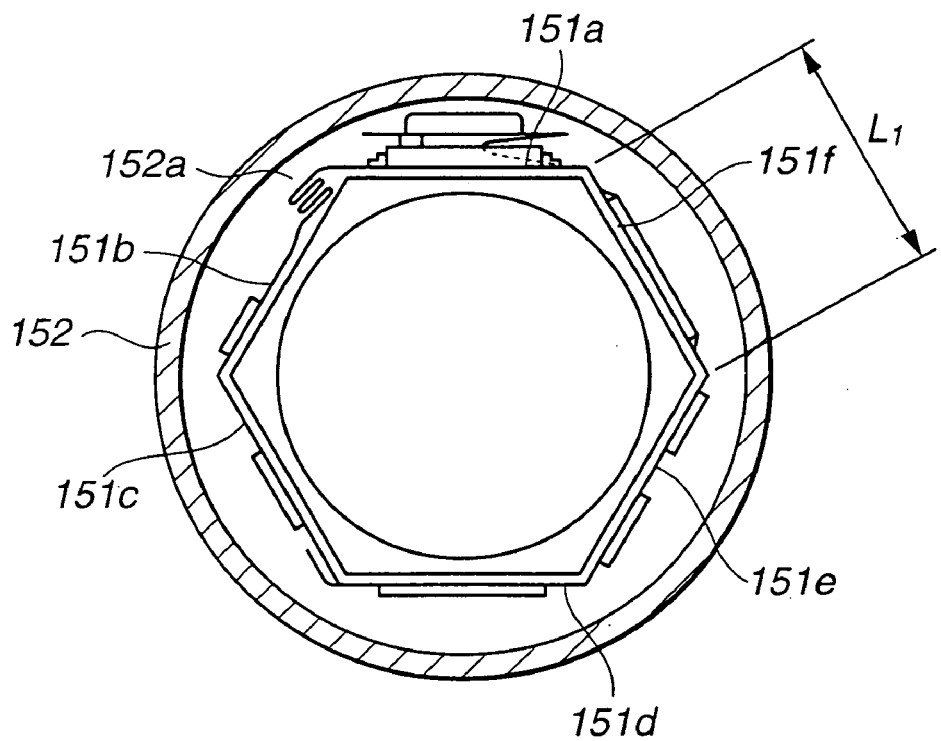
FIG. 38A is a front view showing the mounting structure of conventional printed-circuit boards.
Figure 38B:
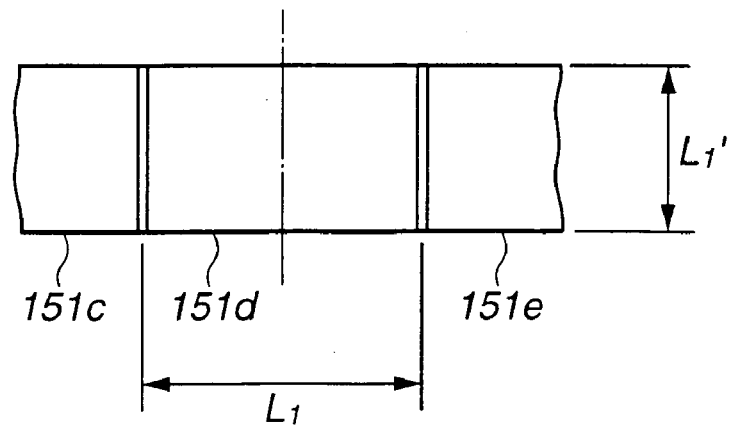
FIG. 38B is a partial developing diagram of the conventional printed-circuit boards shown in FIG. 38A.

When the six printed-circuit boards 201 to 206 having the crossed end portions are attached to the ring shaped space 79 comprising the outer casing 70 and the optical system holding casing 74, for example, reference symbol L denotes a length of a side on the plane orthogonal to the optical axis, of the printed-circuit board 206 as one side of hexagon circumscribed to the outer periphery of the optical system holding casing 74 (refer to FIG. 14). When comparing the length L with a dimension L1 of a side of each of printed-circuit boards 151a to 151f in the mounting structure in which the printed-circuit boards 151a to 151f are hexagonally attached as disclosed in Japanese Unexamined Patent Application Publication No. 7-294790 (refer to FIGS. 38A and 38B), the following relationship is established.

L>L1

Thus, the plane (mounting area) is set large.

The six printed-circuit boards 201 to 206 are accommodated by effectively using a dead space of the space 79 comprising the outer casing 70 and the optical holding casing 74. The plane is increased without making the space 79 larger. Consequently, the degree of freedom on the design is improved upon increasing the mounting area or forming a circuit pattern.

As mentioned above, the camera is formed by attaching the six printed-circuit boards 201 to 206 formed by crossing their planes and hexagonally combining them to the ring shaped space 79 comprising the outer casing 70 and the optical system holding casing 74.

The printed-circuit boards 201 to 206 are accommodated with the increase in their planes (mounting areas) as a result of the effective use of the ring shaped space 79 with their crossed planes. Consequently, the space 79 is reduced in size, the mounting areas of the printed-circuit boards are enlarged, and the degree of freedom on the circuit design is improved.

Figure 17:
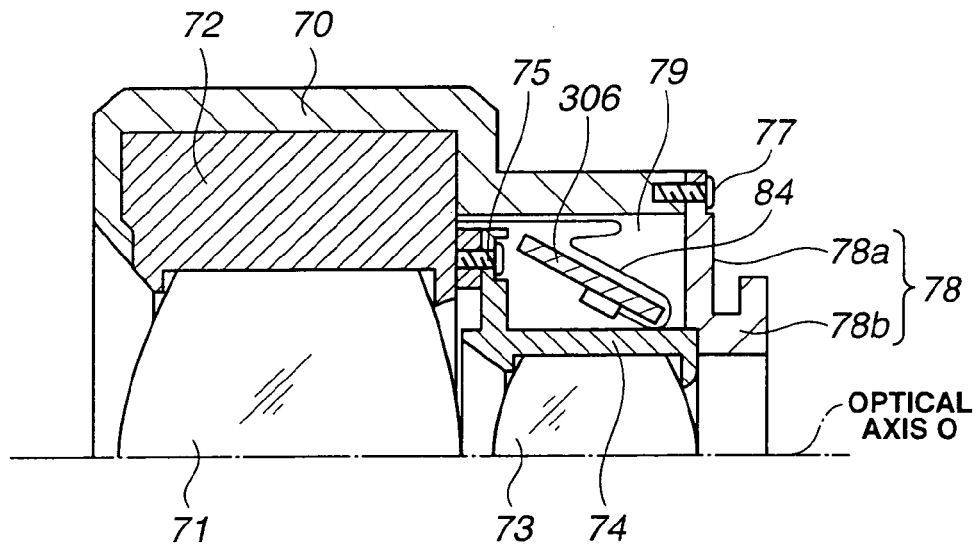
FIG. 17 is a cross-sectional view according to a fifth embodiment of the present invention.

The present invention is not limited to the first to fourth embodiments. The same advantages are obtained according to fifth and sixth embodiments with reference to FIGS. 17 to 21, and FIGS. 22 and 23. However, for the sake of a brief description, the same reference numerals in FIG. 17 as those in FIG. 12 denote the same components and a detailed description thereof is omitted.

Figure 18:
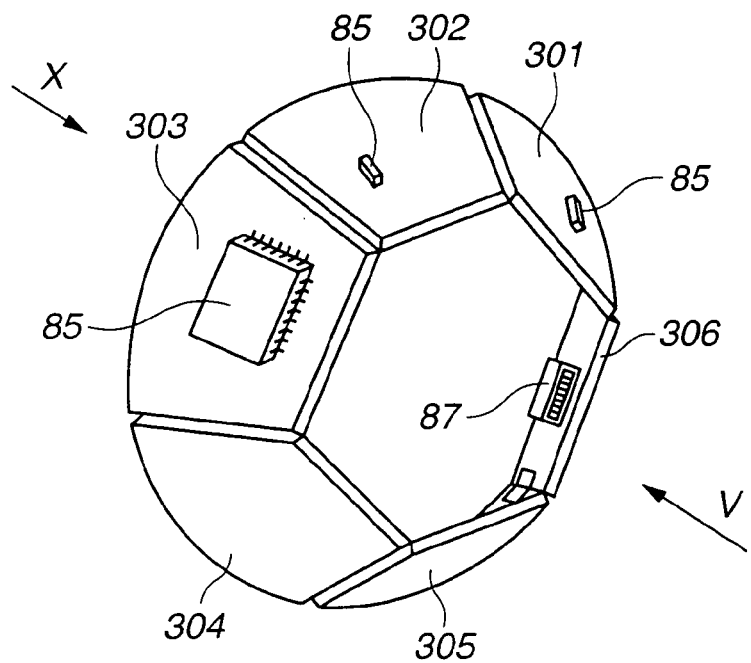
FIG. 18 is a perspective view showing printed-circuit boards shown in FIG. 17.
Figure 19:
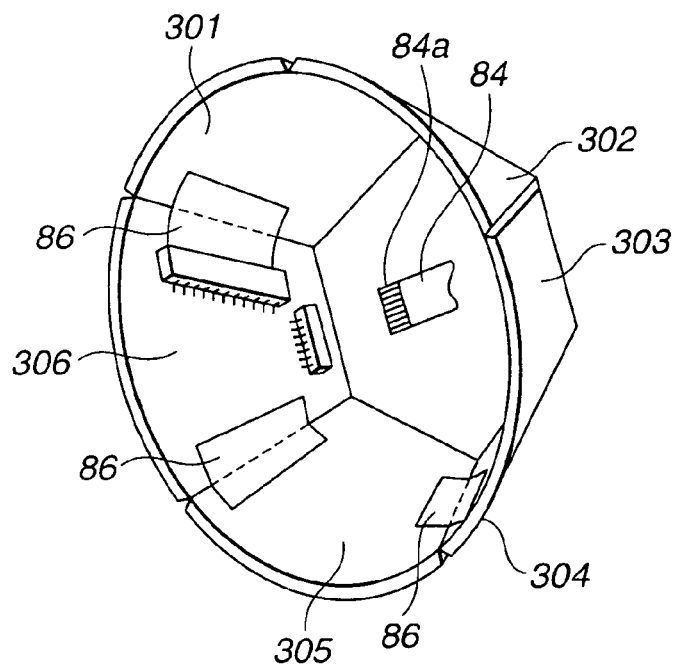
FIG. 19 is a diagram in an X-arrow direction shown in FIG. 18.
Figure 20:
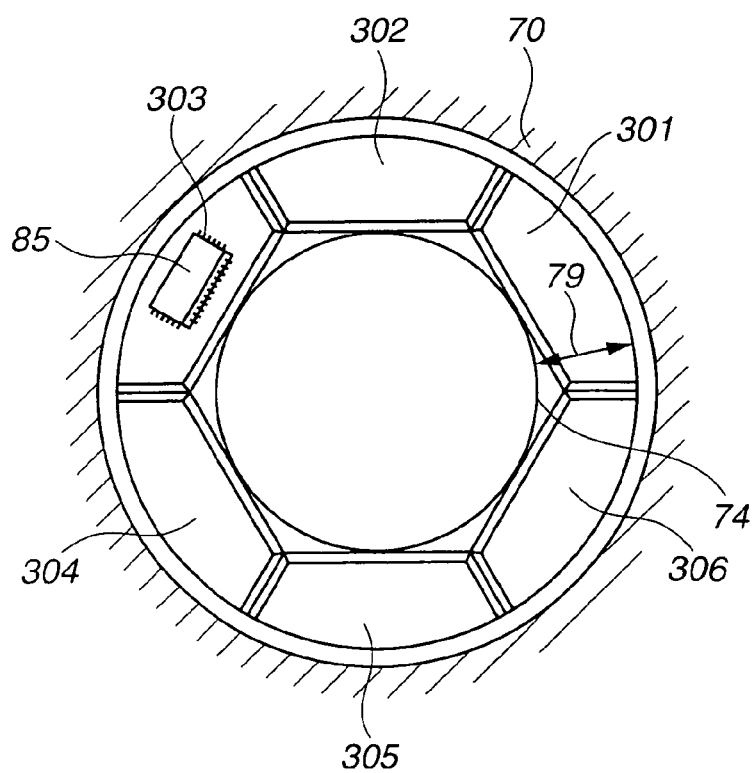
FIG. 20 is a diagram showing in a V-arrow direction shown in FIG. 18.

According to the fifth embodiment, referring to FIGS. 17 to 21, a plurality of, e.g., six printed-circuit boards 301 to 306 are trapezoidally formed to the space 79 formed between the outer casing 70 and the optical system holding casing 74. In this case, the six printed-circuit boards 301 to 306 are formed with their bending (arc) bases and are hexagonally and conically combined as shown in FIGS. 18 to 20.

Figure 21:
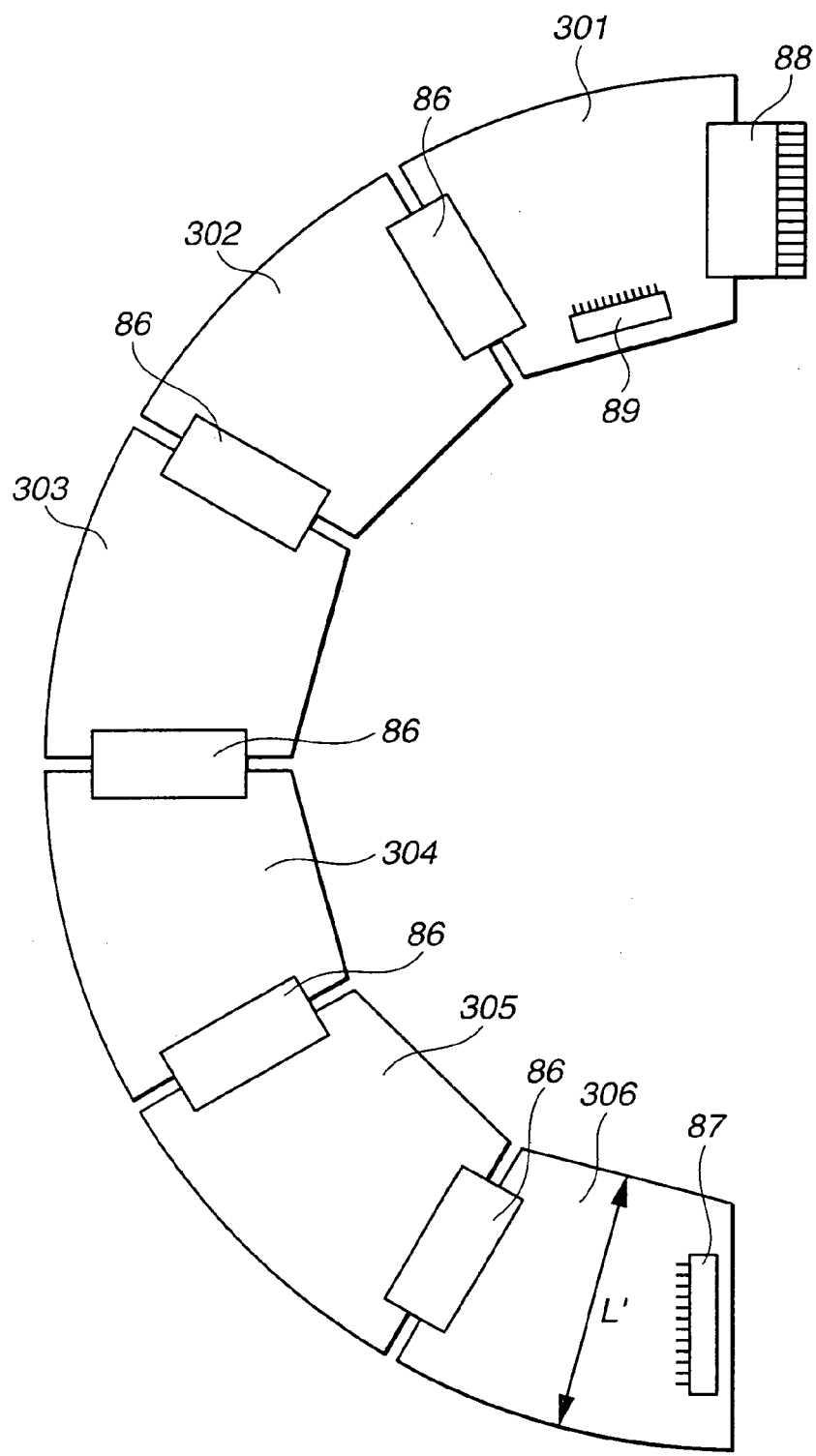
FIG. 21 is a diagram showing a developed state of the printed-circuit boards shown in FIG. 18.

Referring to FIG. 21, in the six printed-circuit boards 301 to 306, bases and upper sides thereof match and hypotenuses thereof are overlapped. Thus, the six printed-circuit boards 301 to 306 are electrically connected via flexible printed-circuit boards 86. Then, both-end ones of the printed-circuit boards 301 and 306 have a connector 87 and a flexible printed-circuit board 88 for connection, and the six printed-circuit boards 301 to 306 are molded hexagonally and conically. In this state, the connector 87 and the flexible printed-circuit board 88 are connected and assembled.

An external connector 89 is mounted on the printed-circuit board 301. The external connector 89 is connected to the connecting terminals 84a (refer to FIG. 19) arranged to the flexible printed-circuit board 84 connected to the lens driving mechanism portion 72.

With the above-mentioned structure, the six printed-circuit boards 301 to 306 assembled hexagonally and conically are arranged to the ring shaped space 79 comprising the outer casing 70 and the optical system holding casing 74 at a predetermined inclination angle to the optical axis. Here, the six printed-circuit boards 301 to 306 have normal vectors, that is, normals of their planes (mounting areas) which are non-orthogonal (oblique) to the optical axis (central axis).

When the six printed-circuit boards 301 to 306 have lengths L' of the sides oblique to the optical axis (refer to FIG. 21) and the length L' is compared with lengths L' of the sides oblique to the optical axis, of the printed-circuit boards 151a to 151f (refer to FIG. 38B) in the mounting structure in which the printed-circuit boards 151a to 151f are assembled hexagonally as disclosed in Japanese Unexamined Patent Application Publication No. 7-294790, the following relationship is established. That is, since the printed-circuit boards 301 to 306 are arranged with a predetermined inclination angle to the optical axis in the optical axis direction, even assuming that the dimension of the space 79 in the optical axis direction is similar to the above case, the following relationship is set.

L'>L1'

Thus, the six printed-circuit boards 301 to 306 have their planes (mounting areas) in the oblique direction large by effectively using a dead space of the space 79 comprising the outer casing 70 and the optical holding casing 74. The planes (mounting areas) of the printed-circuit boards 301 to 306 are increased without making the space 79 larger. Consequently, the mounting areas are increased or the degree of freedom on the design of a circuit pattern is improved.

Figure 22:
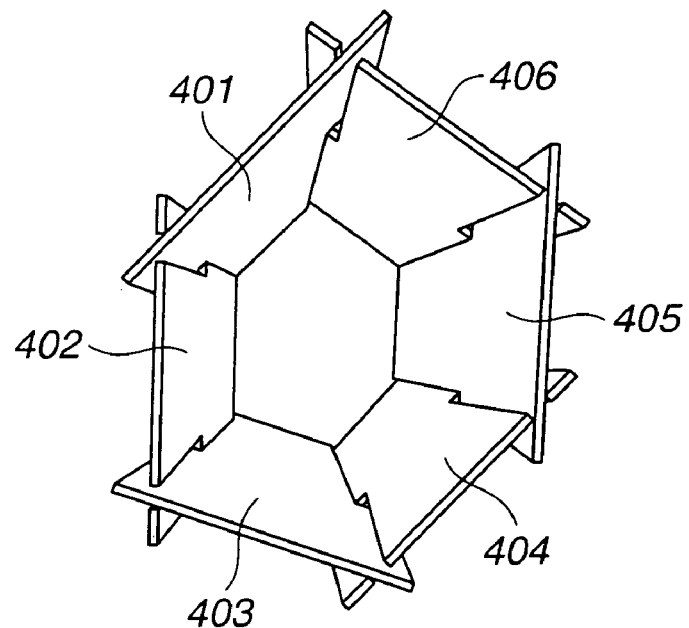
FIG. 22 is a perspective view according to a sixth embodiment of the present invention.
Figure 23:
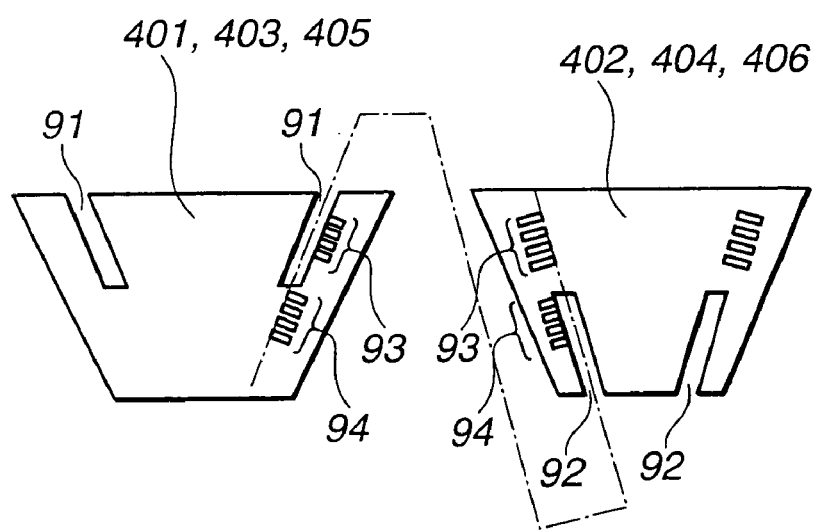
FIG. 23 is an exploded view showing two printed-circuit boards shown in FIG. 22.

Referring to FIGS. 22 and 23, in the mounting structure according to the sixth embodiment, the end portions of the six printed-circuit boards 301 to 306 according to the fifth embodiment as shown in FIGS. 17 to 21 are formed so that their planes are crossed and are combined hexagonally similarly to the case according to the fourth embodiment as shown in FIGS. 12 to 16. The mounting structure according to the sixth embodiment as shown in FIGS. 22 and 23 has the advantages according to the fourth and fifth embodiments and, thus, further has another advantage.

Referring to FIGS. 22 and 23, for the sake of convenience of a description, the same components as those in FIGS. 12 to 21 are designated by the same reference numerals and a detailed description thereof is omitted.

That is, six printed-circuit boards 401 to 406 are substantially trapezoidally formed. Near both ends of the three printed-circuit boards 401, 403, and 405, two elongated and parallelogram notch portions 91 obtained by cutting off their bases in the top direction are formed, respectively. The three remaining printed-circuit boards 402, 404, and 406 have two elongated and parallelogram notch portions 92 obtained by cutting off the tops thereof in the bottom direction at a predetermined interval, respectively. The two notch portions formed on the single printed-circuit board are in non-parallel with each other, and the two notch portions are formed so that they are along hypotenuses of trapeziums therenear or so that they are slightly in non-parallel with the hypotenuses.

The adjacent printed-circuit boards of the six ones 401 to 406 have connecting lands 93 and 94. In the six printed-circuit boards 401 to 406, the notch portions 91 and 92 are combined, thus, the connecting lands 93 and 94 are adjacent to each other, and they are adjacently connected by soldering.

With the above structure, the six printed-circuit boards 401 to 406 are used for a horn space different from the ring shaped space according to the fifth embodiment as shown in FIGS. 17 to 21. Consequently, the six printed-circuit boards 401 to 406 are effectively used. According to the six embodiment, the area for component mounting on the printed-circuit boards is not necessarily increased, and is used for the horn space different from the simply ring shaped space and the degree of freedom on design is improved.

According to the fourth to sixth embodiments, the six printed-circuit boards 201 to 206, 301 to 306, and 401 to 406 are combined hexagonally and prismatically, or hexagonally and petrosally. However, the present invention is not limited to this and can be combined polygonally and prismatically, or polygonally and petrosally.

Further, according to the fourth to sixth embodiments, the rigid printed-circuit boards are used. However, the present invention is not limited to the structure using the rigid printed-circuit boards and, for example, it is possible to use flexible-type flexible boards.

In addition, according to the fourth to sixth embodiments, the present invention is used for the camera. However, it is not limited to this and is used for an electronic device including various optical devices having the ring shaped space. In any case, the same advantages are obtained.

As mentioned above, according to the fourth to sixth embodiments, it is possible to provide an electronic device with the small size, in which the mounting area of the printed-circuit board is enlarged or the degree of freedom is improved on the design of the printed-circuit board.

Next, a description is given of a barrel device according to the seventh embodiment of the present invention.

Figure 24:
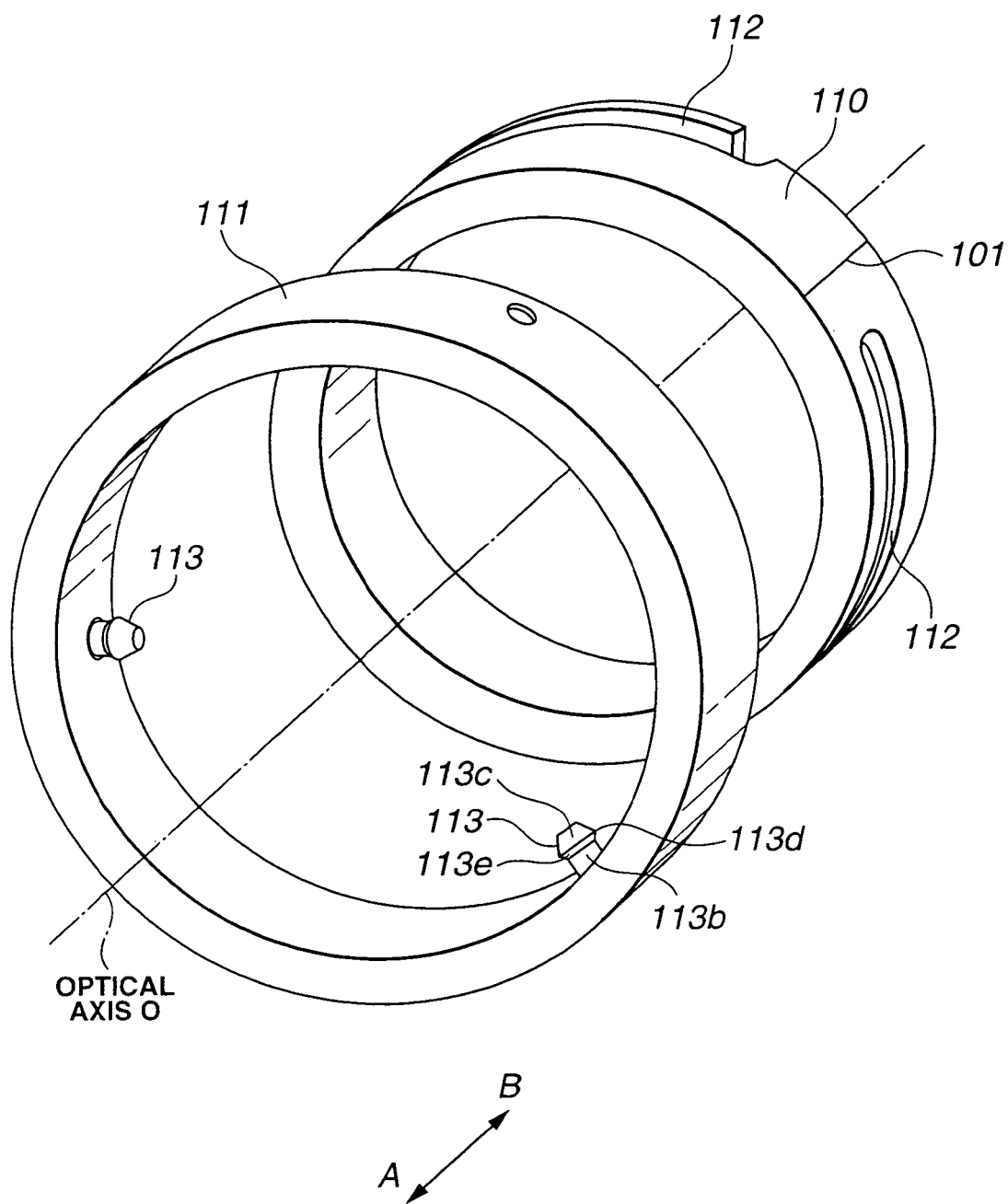
FIG. 24 is an exploded perspective view showing the structure of a barrel device according to a seventh embodiment of the present invention.
Figure 25:
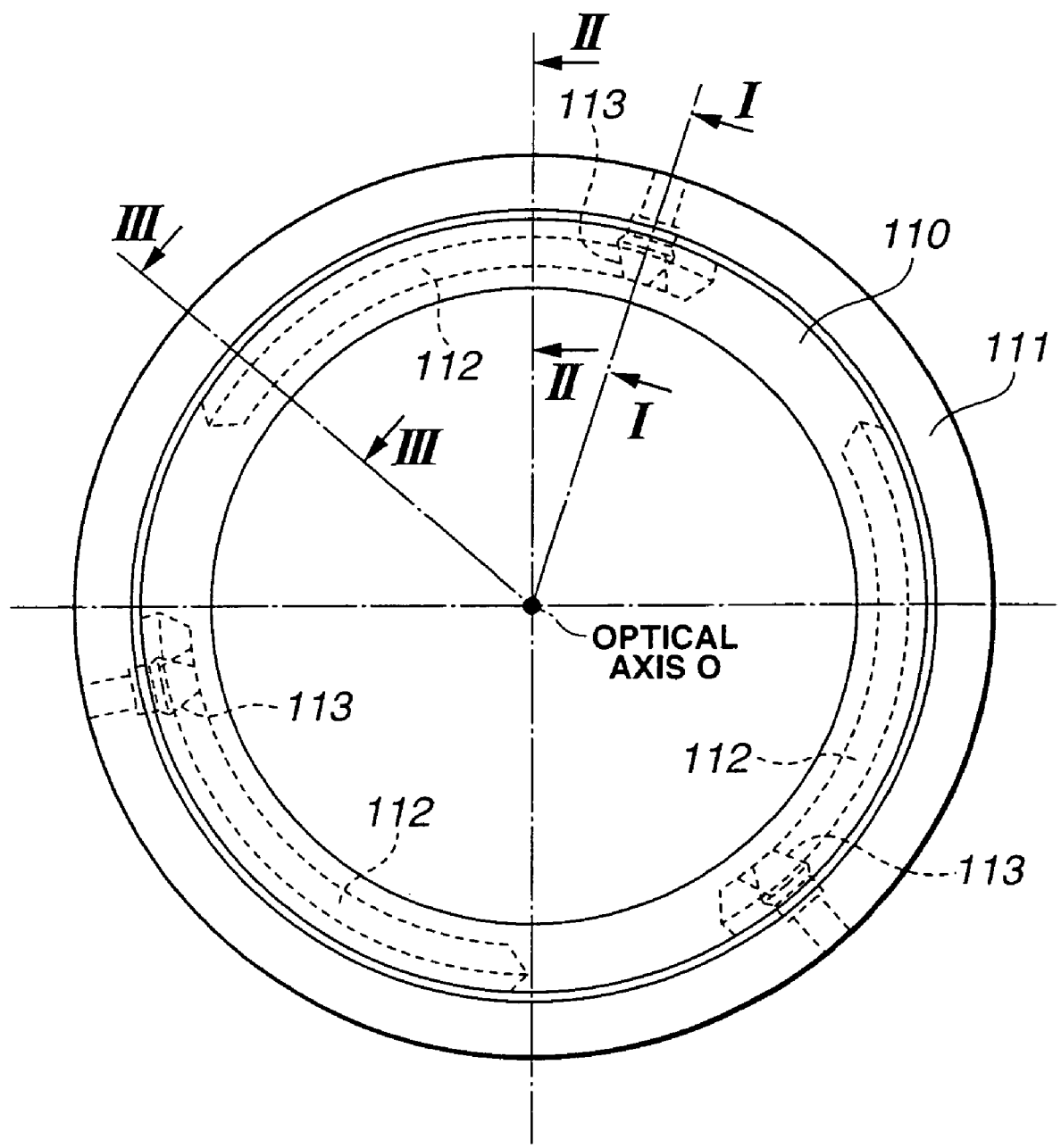
FIG. 25 is a front view showing a state in which a first and a second frame members shown in FIG. 24 are assembled to be moved linearly in the optical axis direction.

FIG. 24 shows the barrel device according to the seventh embodiment. The first and the second frame members 110 and 111 form a lens barrel, and can be moved linearly in the directions of arrows A and B (optical axis direction). That is, three cam grooves 112 as a feature of the present invention are arranged to an outer-peripheral surface of the first frame member 110 equally at an angle of 120° in the circumferential direction (refer to FIG. 25). Three conical and trapezoidal cam followers 113 are pressed into an inner-peripheral surface of the second frame member 111 equally at an angle of 120° corresponding to the three cam grooves 112. Referring to FIG. 25, the three cam followers 113 of the second frame member 111 are inserted in cam grooves 111 of the first frame member 110.

The cam follower 113 comprises: a shaft portion 113a for fixing to the second frame member 111; a step shaft portion (base end portion) 113b having a diameter slightly larger than the diameter of the shaft portion 113a coaxial thereto, for arranging a step portion for positioning the second frame member of the cam follower 113 in the thrust direction (axial direction); a crucible-formed portion (taper) 113c which is engaged with and slidably touched to the cam grooves 112 at the edges of the cam follower; and a crucible-former portion (taper) 113e formed towards the step shaft portion 113b so as to reduce the diameter from a large-diameter portion 113d of the crucible-former portion (taper) 113c. Thus, the crucible-former portion (taper) 113e has an inverse taper angle to a taper angle of the crucible-former portion (taper) 113c. The central axis (center line) of the cam follower 113 is vertical to the bottom (cam bottom) of the cam groove 112.

With the above structure, the first frame 110 is rotated by a driving mechanism (not shown) and, in accordance with the rotation, the cam follower 113 of the second frame member 111 is slidably guided along the cam groove 112 of the first frame member 110. Thus, the second frame member 111 is moved linearly to the first frame member 110 in the optical axis direction.

Figure 26:
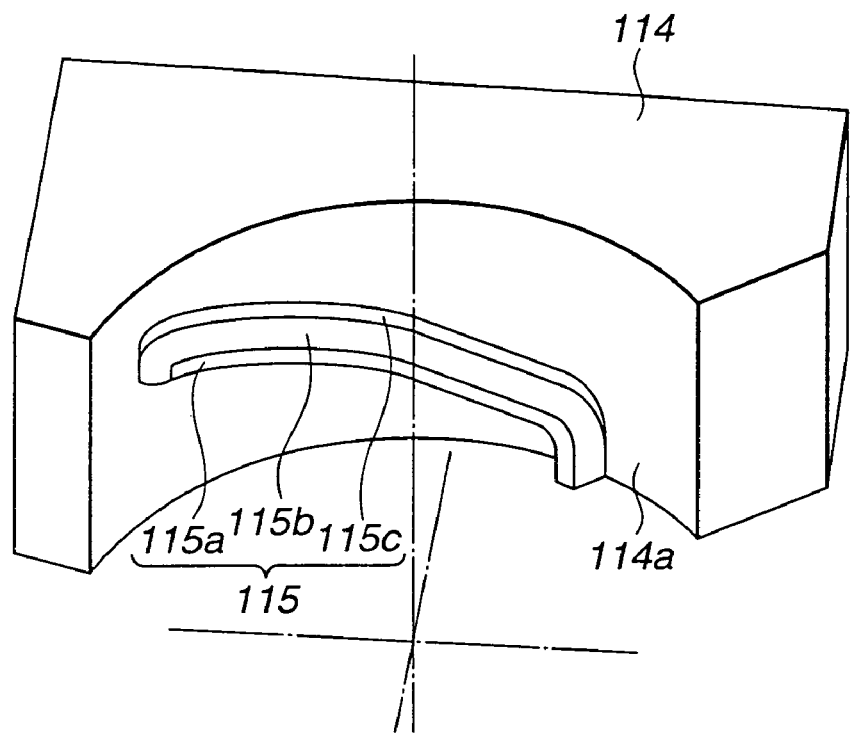
FIG. 26 is a perspective view showing one of a plurality of slide molds of the first frame member shown in FIG. 24.

First, prior to a description of the structure of the first frame member 110 having the cam groove 112 as another feature of the present invention, a method for molding the first frame member 110 is described. Referring to FIG. 26, three slide molds 114 for molding the portion at the angle of 120° with a ring shape are circularly combined and an outer-peripheral surface of the first frame member 110 is molded by molding (injection molding).

On the slide molds 114, projected cam portions 115 are arranged to a wall surface 114a which is caved and bent corresponding to the outer-peripheral surface of the first frame member 110, corresponding to the cam grooves 112. Further, a guide portion and a driving portion (not shown) are arranged to the slide molds 114, respectively. One slide mold 114 forms a portion having the angle of 120° to the first frame member 110 and the three slide molds 114 mold the entire outer periphery of the first frame member 110 in corporation therewith. The one slide mold 114 is molded in a direction connecting points II—II shown in FIG. 25 and then two remaining slide molds 114 are molded in a direction at an interval of an angle of 120° to the direction II—II.

Here, a description is given of the structure of the cam grooves 112 of the first frame member 110 which is molded by using the three slide molds 114 as another feature of the present invention.

Figure 27:
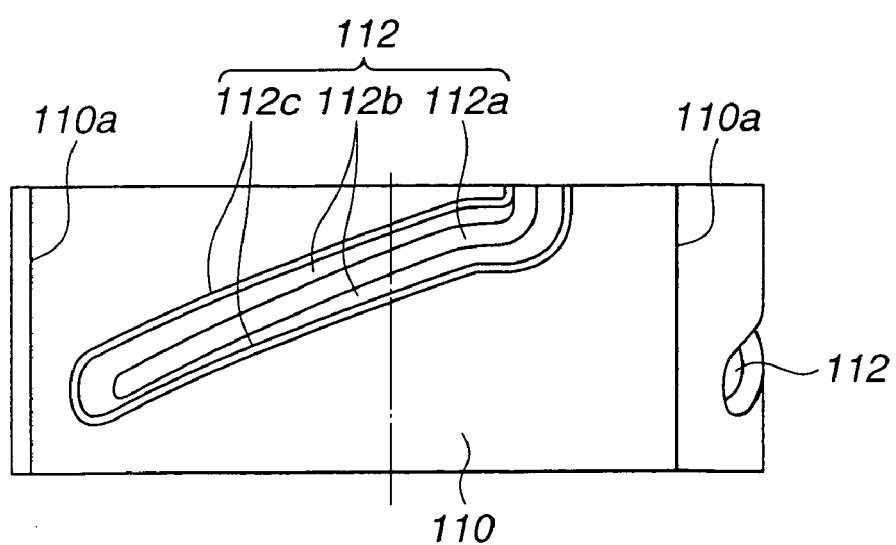
FIG. 27 is a plan view showing the first frame member shown in FIG. 24 in a pulling-out direction of the slide mold.

On the outer-peripheral surface of the first frame member 110, the three cam grooves 112 are arranged at the interval of the angle of 120° in the circumferential direction. A bottom portion (cam bottom) 112a with a predetermined width is formed to have a dimension corresponding to the moving distance of the second frame member 111. The bottom portion 112a has, on both side-walls thereof, first wall surfaces 112b as a pair of first inclined planes having an inclination to increase the width toward the peripheral surface (outer-peripheral surface) from the bottom portion 112a with which the taper on the crucible-former peripheral wall of the cam follower 113 slidably comes into contact. Further, the opening side of the first wall surfaces 112b has second wall surfaces 112c as second inclined planes substantially continuously parallel with the molding direction. FIG. 27 shows a diagram of the first frame member 110 shown in FIG. 24 in the top direction. Referring to FIG. 27, reference numeral 110a denotes a parting line which is generated by the matching of the slide molds 114.

The bottom portion 112a and first and second wall surfaces 112b and 112c in the cam groove 112 of the first frame member 110 are formed by a cam edge surface 115a and first and second cam surfaces 115b and 115c in a projected cam portion 115 arranged to the slide molds 114. It is more advantageous in views of a function of the present invention to reduce the angle formed by the second wall surfaces 112c though the larger angle formed by the second wall surfaces 112c enables the molds to easily be pull out. Thus, the second wall surfaces 112c are set in consideration of a pulling-out inclination to the direction substantially parallel to the mold pulling-out direction. Preferably, the mold pulling-out inclination may be set to have an angle of substantially 1° or more and 10° or less in consideration of the departing of the cam follower 113.

Figure 28A:
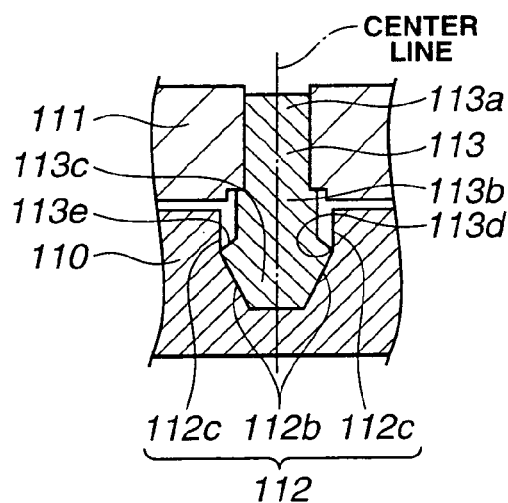
FIG. 28A is a cross-sectional view showing a relationship between a cam follower and a cam groove in a state in which the cam follower is located at the position on a I—I cross-section passing through the optical axis shown in FIG. 25.
Figure 28B:
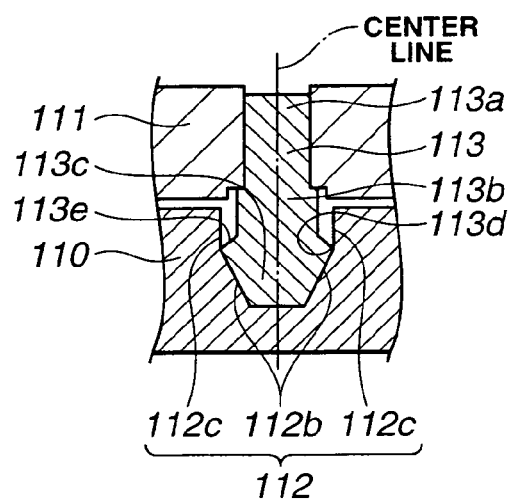
FIG. 28B is a cross-sectional view showing a relationship between the cam follower and the cam groove in a state in which the cam follower is located at the position on a II—II cross-section passing through the optical axis shown in FIG. 25.
Figure 28C:
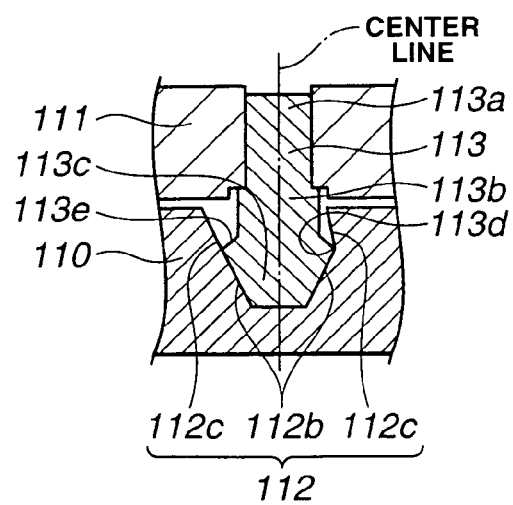
FIG. 28C is a cross-sectional view showing a relationship between the cam follower and the cam groove in a state in which the cam follower is located at the position on a III—III cross-section passing through the optical axis shown in FIG. 25.
Figure 29A:
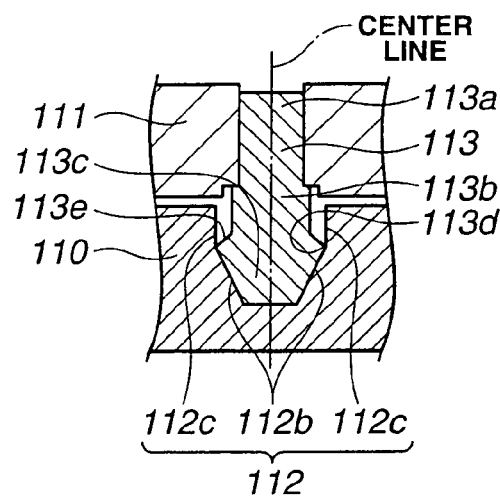
FIG. 29A is a cross-sectional view of the cam follower and the cam groove on the cross section vertical to the center line of the cam groove, passing through the center line of the cam follower, when the cam follower is located at the position on the cross section shown in FIG. 28A.
Figure 29B:
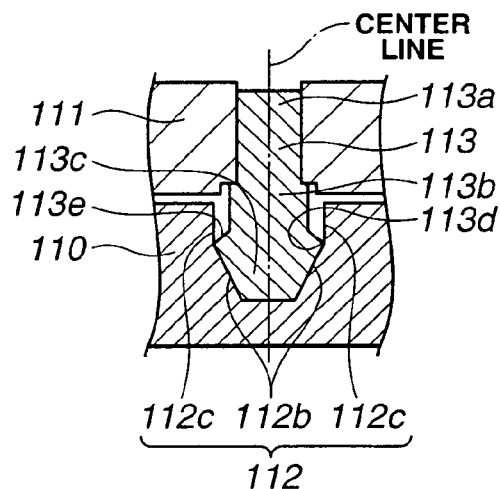
FIG. 29B is a cross-sectional view of the cam follower and the cam groove on the cross section vertical to the center line of the cam groove, passing through the center line of the cam follower, when the cam follower is located at the position on the cross section shown in FIG. 28B.
Figure 29C:
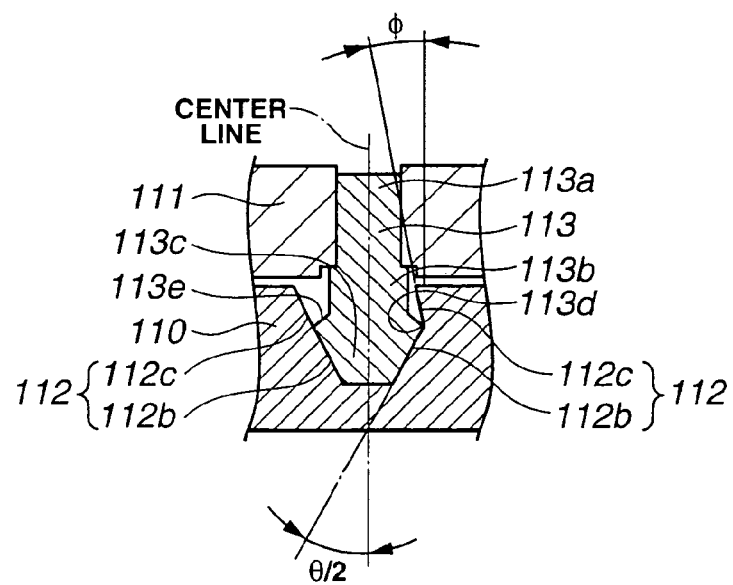
FIG. 29C is a cross-sectional view of the cam follower and the cam groove on the cross section vertical to the center line of the cam groove, passing through the center line of the cam follower, when the cam follower is located at the position on cross section shown in FIG. 28C.

A detailed description is given of the arrangement structure of the cam groove 112 of the first frame member 110 and the cam follower 113 of the second frame member 111 with reference to FIGS. 28A to 28C and FIGS. 29A to 29C. FIGS. 28A to 28C show cross-sectional views near planes including center line of the cam follower 113 and the optical axis shown in FIG. 25. FIGS. 29A to 29C show cross-sectional views vertical to the center line (line of the cam grooves) of the cam groove 112, passing through the center lines of the cam followers 113 at the same positions as those shown in FIGS. 28A to 28C.

In other words, FIGS. 28A to 28C show I—I, II—II, and III—III cross-sectional views when the cam followers 113 are at the cross-sectional positions of the I—I cross section, II—II cross section, and III—III cross section shown in FIG. 24. FIGS. 29A to 29C show cross-sectional views of cross sections vertical to the center lines (cam lines) of the cam groove 112 passing through the center line of the cam follower 113 when the cam follower 113 is at the position shown in FIGS. 28A to 28C. As will clearly be understood with reference to FIGS. 29A to 29C, the first wall surfaces 112b are set to have substantially the same opening angle (taper angle) θ as that of the tapers of the cam followers 113, and the second wall surfaces 112c are set to have a predetermined mold pulling-out inclination to the mold pulling-out direction throughout the entire lengths thereof, substantially in parallel with each other.

Among the cross sections passing though the center lines of the cam follower 113 shown in FIGS. 29A to 29C, on that shown in FIG. 29B, the mold pulling-out direction of the slide molds 114 matches the center line of the cam follower 113. As shown in FIG. 29B, both of the second wall surfaces 112c have a slightly opening angle with the same mold pulling-out inclination. There is such a change that as the second wall surfaces 112c are remoter from the positions thereof shown in FIG. 29B, one of the second wall surfaces 112c is opened and another is closed. In the example, the positions of the second wall surfaces 112c in FIG. 29C are remoter than those in FIG. 29A from those in FIG. 29B. Thus, the positions in FIG. 29C largely change as compared with those in FIG. 29B. The one of the second wall surfaces 112c is at the same position as those of the first wall surfaces 112b, and the other is more inner in the cam grooves 112 than the first wall surfaces 112b, that is, it is near the cam follower 113 at an angle $\phi$ to the center line of the cam follower 113 on the cross section.

In other words, at the position in FIG. 29C, the one of the second wall surfaces 112c has a predetermined inclination different from those of the first wall surfaces 112b in the inner direction of the width of the cam groove 112 to the base end portion of the cam follower 113, and the other second wall surface 112c has an inclination slightly different from those of the first wall surfaces 112b in the outer direction of the width. Thus, the cam follower 113 has a base end portion 113b which is out of the inner-projected portion of the second wall surface 112c.

As mentioned above, in most parts of the cam groove 112 of the first frame member 110, the opening angle of the second wall surfaces 112c is set to be smaller than the opening angle of the first wall surfaces 112b. For example, the foregoing portions are shown in FIGS. 28A and 28B and FIGS. 29A and 29B. When unnecessary external force is applied to the lens barrel, the cam follower 113 has a hook between the second wall surfaces 112c and the large diameter portion 113d of the cam follower 113. Thus, the cam follower 113 is not detached from the cam groove 112, as compared with the case in which no second wall surfaces 112c are provided. Since only the first wall surfaces 112b are slidably touched to the cam follower 113, the opening angle of the second wall surfaces 112c different from that of the first wall surfaces 112b does not influence on the normal operation.

As mentioned above, in the barrel device, the first frame member 110 includes the first wall surfaces 112b slidably touched to the taper 113c of the cam follower 113 and the cam grooves 112 having the second wall surfaces 112c continuously substantially in parallel with the mold pulling-out direction on the first wall surfaces 112b, and the tapers of the cam follower 113 in the second frame member 111 are engaged with the cam grooves 112 to be slidably touched thereto, thereby combining the first and second frame members 110 and 111 to relatively move them. Consequently, when the unnecessary external force is applied, the second wall surfaces 112c of the cam groove 12 regulate the large diameter portion 113d of the cam follower 113 and the detaching from the cam grooves 112 is prevented. In particular, as the cam followers 113 are more adjacent to the end portions of the cam grooves 112, the hook portion of the second wall surfaces 112c is increased as an under-cut portion to the large diameter portion 113d in the center line of the cam follower 113, advantageously, the detaching of the cam follower 113 is prevented.

Next, a description is given of a barrel device according to the eighth embodiment of the present invention with reference to FIGS. 30 to 37E.

The present invention is not limited to the seventh embodiment. For example, referring to FIGS. 30 to 37E, a cam groove 121 is arranged onto an inner-peripheral surface of a first frame member 120, a cam follower 123 is arranged onto an outer-peripheral surface of a second frame member 122, and the first frame member 120 and the second frame member 122 are relatively moved in the barrel device according to the eighth embodiment. In this case, according to the eighth embodiment, the same advantages as those according to the seventh embodiment are obtained.

Figure 30:
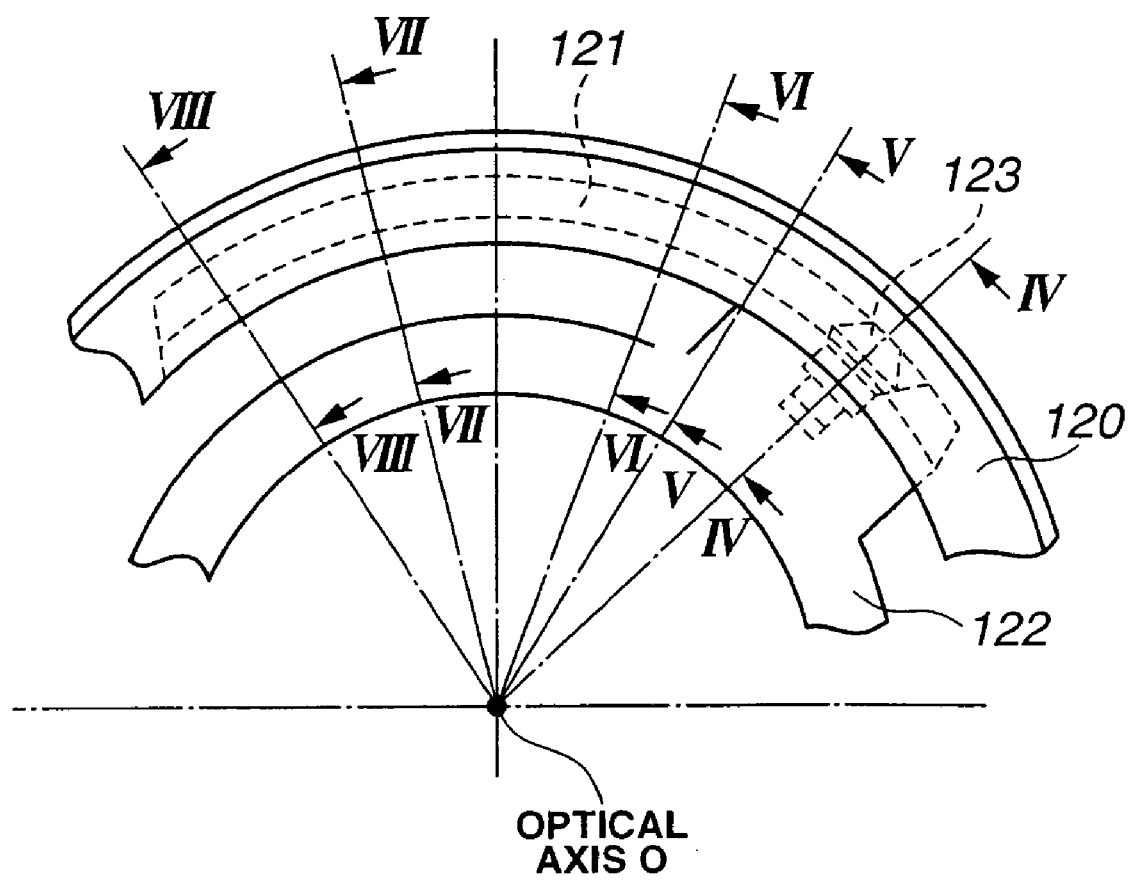
FIG. 30 is a front view showing a state in which a part of a barrel device is cut out according to an eighth embodiment of the present invention.
Figure 31:
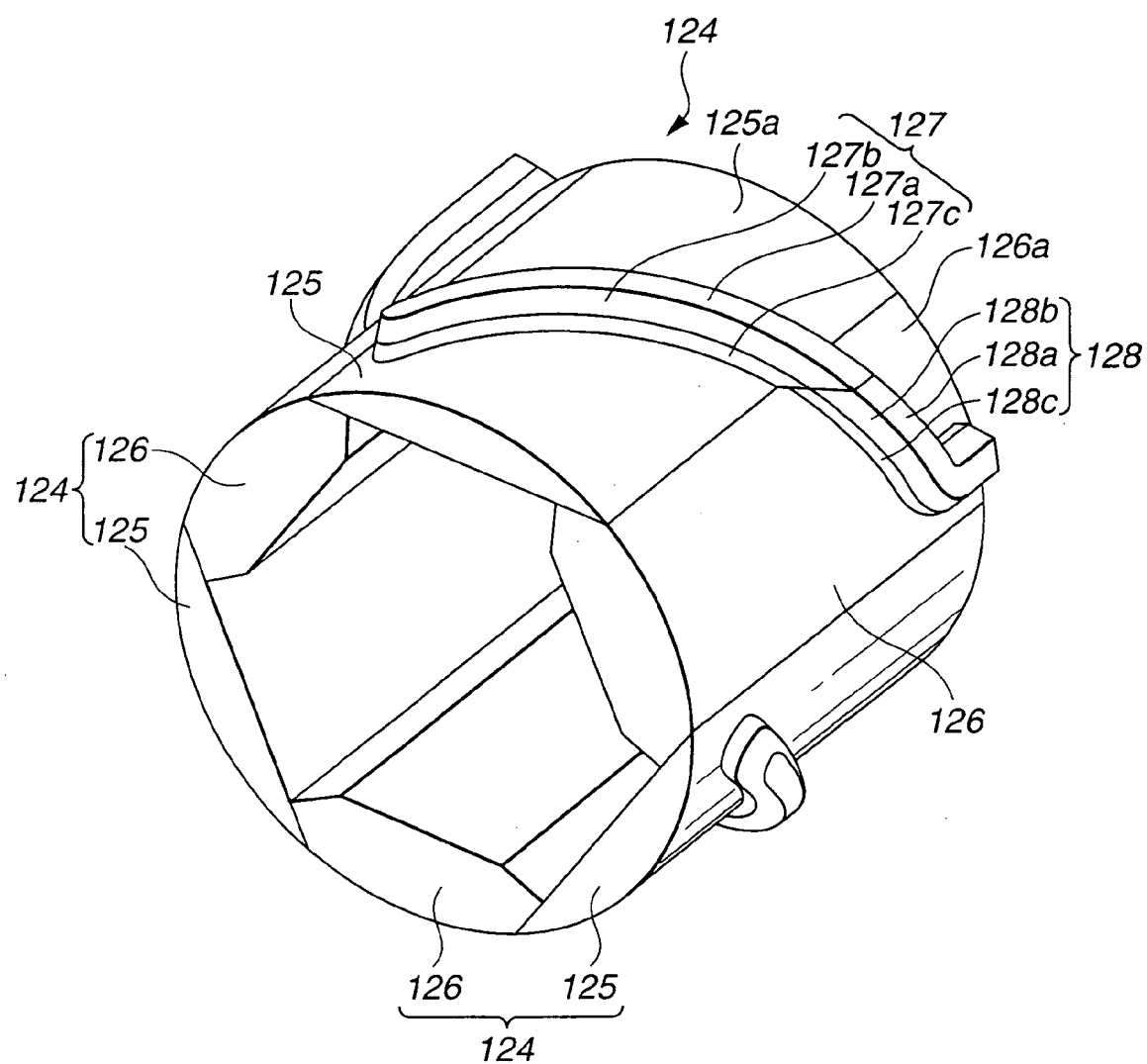
FIG. 31 is a perspective view showing slide molds of a first frame member shown in FIG. 30.
Figure 32:
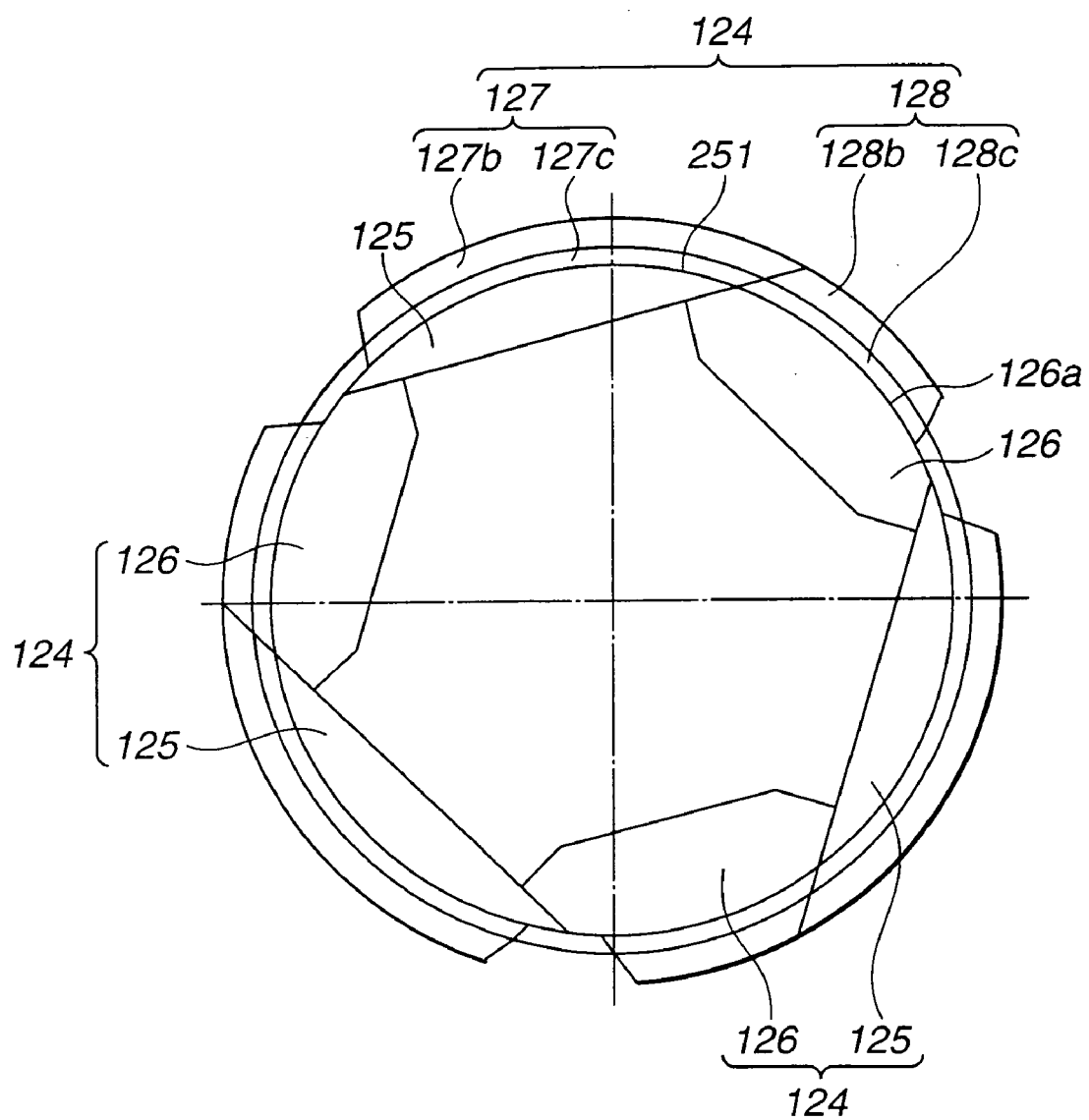
FIG. 32 is a plan view showing a closed state of the slide molds shown in FIG. 31 in the front direction.
Figure 33:
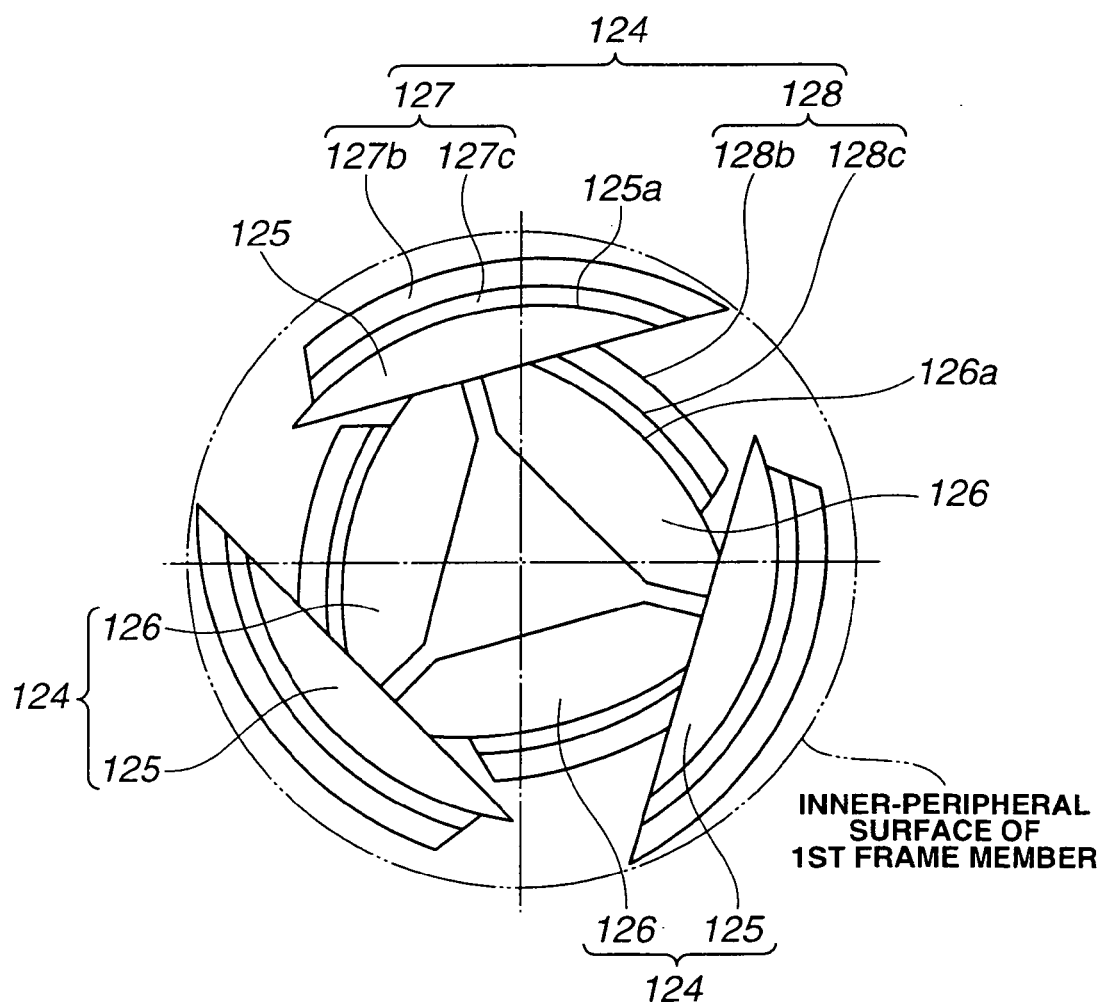
FIG. 33 is a plan view showing an opened state of the slide molds shown in FIG. 32 in the front direction.
Figure 34:
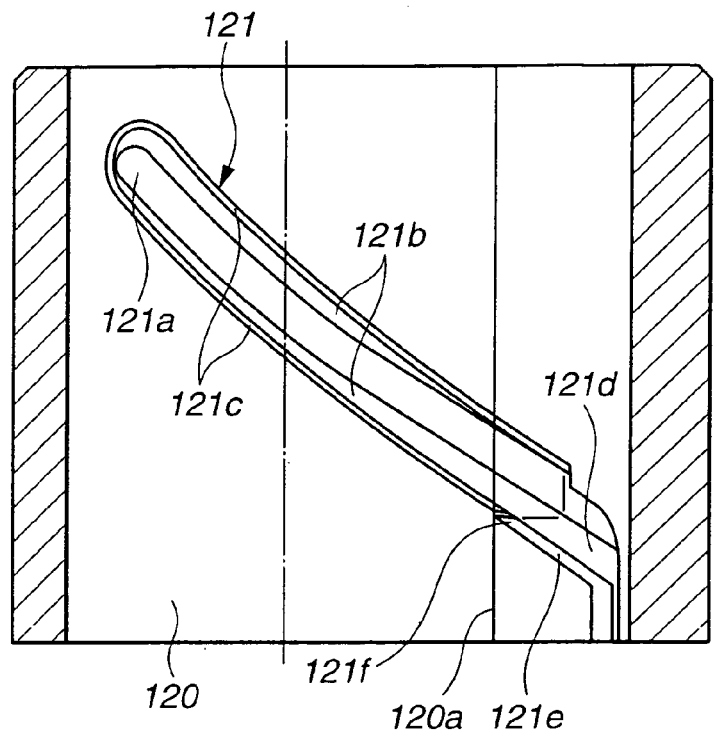
FIG. 34 is a partial cross-sectional view showing the first frame member shown in FIG. 30 in a pulling-out direction of a large slide-mold in the slide mold.
Figure 35:
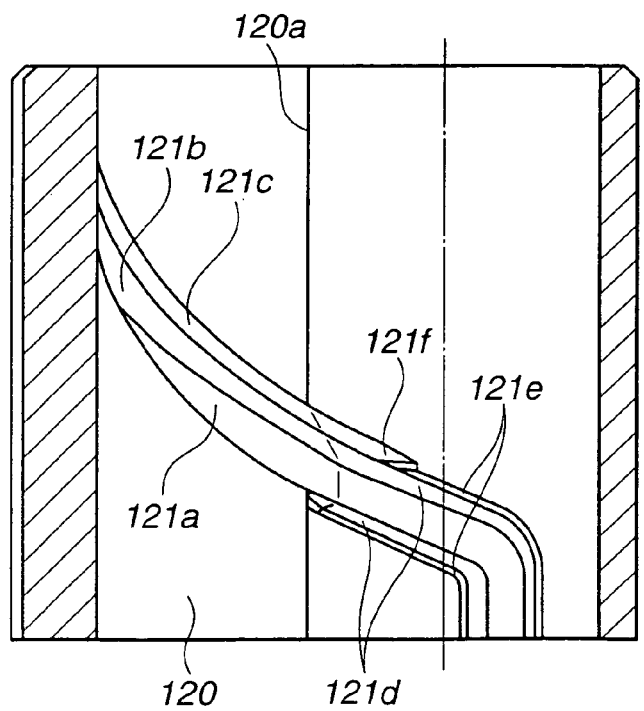
FIG. 35 is a partial cross-sectional view showing the first frame member shown in FIG. 30 in a pulling-out direction of a small slide-mold in the slide mold.
Figure 36A:
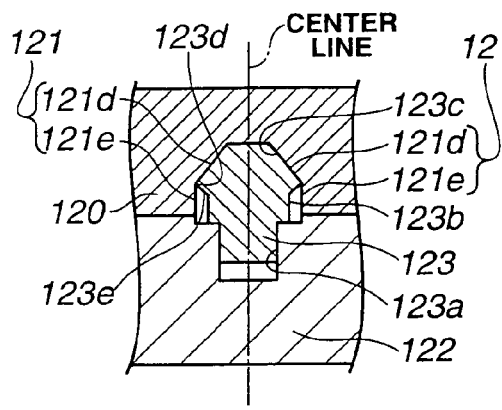
FIG. 36A is a cross-sectional view showing a relationship between a cam follower and a cam groove in a state in which the cam follower is located at the position on a IV—IV cross-section passing through the optical axis shown in FIG. 30.
Figure 36B:
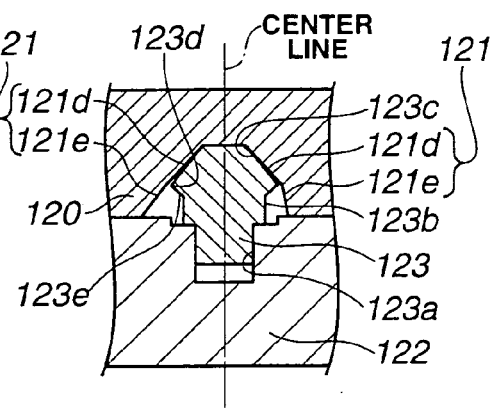
FIG. 36B is a cross-sectional view showing a relationship between the cam follower and the cam groove in a state in which the cam follower is located at the position on a V—V cross-section passing through the optical axis shown in FIG. 30.
Figure 36C:
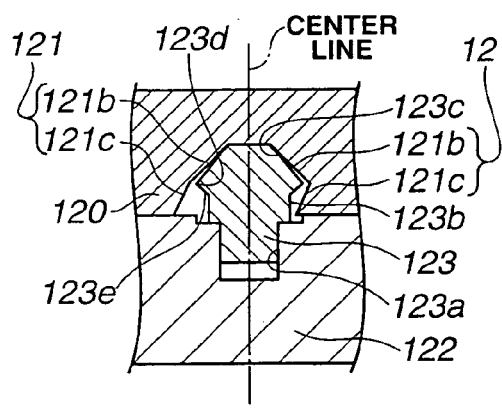
FIG. 36C is a cross-sectional view showing a relationship between the cam follower and the cam groove in a state in which the cam follower is located at the position on a VI—VI cross-section passing through the optical axis shown in FIG. 30.
Figure 36D:
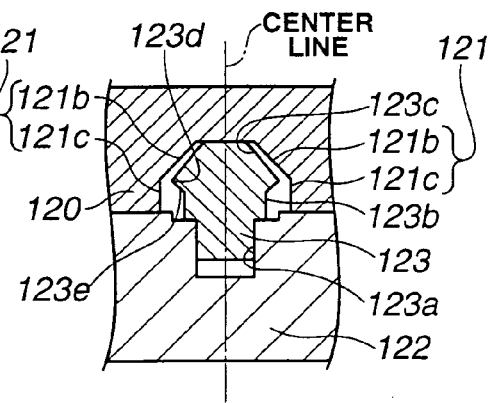
FIG. 36D is a cross-sectional view showing a relationship between the cam follower and the cam groove in a state in which the cam follower is located at the position on a VII—VII cross-section passing through the optical axis shown in FIG. 30.
Figure 36E:
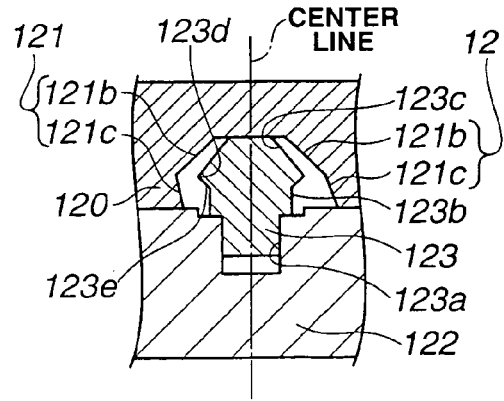
FIG. 36E is a cross-sectional view showing a relationship between the cam follower and the cam groove in a state in which the cam follower is located at the position on a VIII—VIII cross-section passing through the optical axis shown in FIG. 30.
Figure 37A:
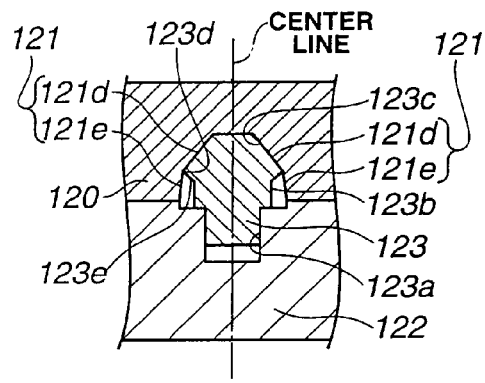
FIG. 37A is a cross-sectional view showing the cam follower and the cam groove on a cross section vertical to the center line of the cam groove, passing through the center line of the cam follower at the position on the cross section shown in FIG. 36A.
Figure 37B:
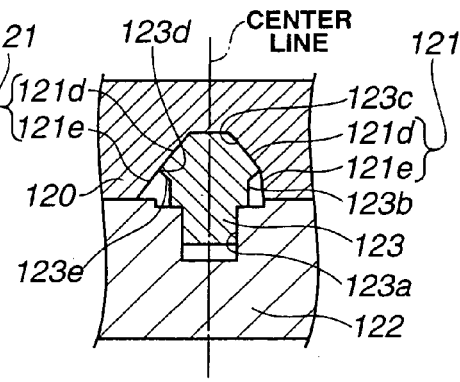
FIG. 37B is a cross-sectional view showing the cam follower and the cam groove on a cross section vertical to the center line of the cam groove, passing through the center line of the cam follower at the position on the cross section shown in FIG. 36B.
Figure 37C:
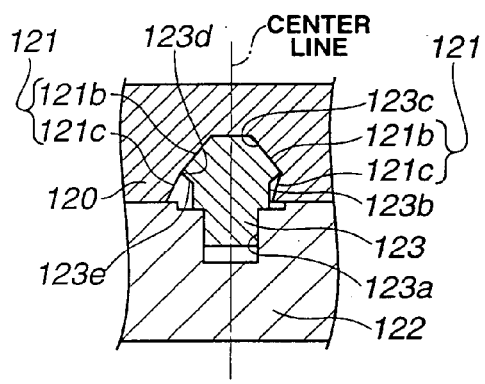
FIG. 37C is a cross-sectional view showing the cam follower and the cam groove on a cross section vertical to the center line of the cam groove, passing through the center line of the cam follower at the position on the cross section shown in FIG. 36C.
Figure 37D:
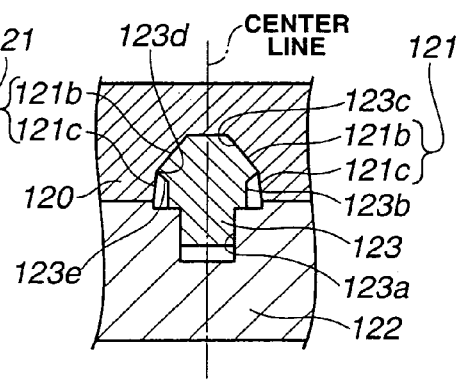
FIG. 37D is a cross-sectional view showing the cam follower and the cam groove on a cross section vertical to the center line of the cam groove, passing through the center line of the cam follower at the position on the cross section shown in FIG. 36D.
Figure 37E:
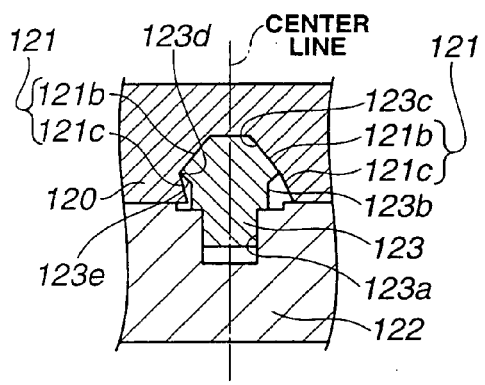
FIG. 37E is a cross-sectional view showing the cam follower and the cam groove on a cross section vertical to the center line of the cam groove, passing through the center line of the cam follower at the position on the cross section shown in FIG. 36E.

FIG. 30 shows a cut-off part of the barrel device in the optical direction. FIG. 31 shows a perspective view showing slide molds 124 used for molding the first frame member 120. FIG. 32 shows a closed state of the slide molds 124 in the optical axis direction, that is, a state for injection-molding a molded part (product). FIG. 33 shows an opened state of the slide molds 124 in the optical direction, that is, a state in the injection molding of the molded part (product) is completed and the molded part is pulled out from the molds. FIG. 34 shows a state in which the first frame member 120 is viewed from the mold pulling-out direction of a large slide mold 125 of the slide mold 124. FIG. 35 shows a state in which the first frame member 120 is viewed in the molding pulling-out direction of a small mold 126 of the slide mold 124. FIGS. 36A to 36E show planes including the optical axis and show cross sections of the cam groove 121 and the cam follower 123 in a state in which the cam follower is positioned on IV—IV to VIII—VIII cross sections different from those of planes rotated around the optical axis. FIGS. 37A to 37E show cross sections on planes vertical to the cam groove 121 at the positions of the cam follower 123 shown in FIGS. 36A to 36E.

That is, the three cam grooves 121 as another feature of the present invention are arranged onto an inner-peripheral surface of the first frame member 120 equally at an angle of 120° in the circumferential direction (refer to FIG. 30). The three conical and trapezoidal cam followers 123 with the same shape as that of the cam followers 113 are pressed and arranged onto an outer-peripheral surface of the second frame member 122 equally at an angle of 120° corresponding to the three cam grooves 121. The three cam followers 123 of the second frame member 122 are inserted in and engaged with the cam grooves 121 of the first frame member 120. Thus, the first frame 120 is rotated by a driving mechanism (not shown) and, in accordance with the rotation, the cam follower 123 of the second frame member 122 is slidably guided along the cam grooves 121 of the first frame member 120 and is moved linearly in the optical axis direction.

The cam follower 123 comprises: a shaft portion 123a for fixing to the second frame member 122; a step shaft portion (base end portion) 123b having a diameter slightly larger than the diameter of the shaft portion 123a, for arranging a step portion for positioning the second frame member 122 of the cam follower 123 in the thrust direction (shaft direction); a crucible-former portion (taper) 123c which is engaged with and is slidably touched to the cam grooves 123 at the edges of the cam follower; and a crucible-former portion (taper) 123e formed toward the shaft portion 123a so as to reduce the diameter from a large-diameter portion 123d of the crucible-former portion (taper) 123c. Thus, the crucible-former portion (taper) 123e has an inverse taper angle to a taper angle of the crucible-former portion (taper) 123c. The central axis (center line) of the cam follower 123 is vertical to the bottom portion (cam bottom) of the cam groove 121.

First, prior to a description of the structure of the first frame member 120 having the cam groove 121 as a feature of the eighth embodiment of the present invention, a method for molding the first frame member 120 is described. Three sets of slide molds 124 are circularly combined on the outer periphery at the angle of 120° and, thus, an inner-peripheral surface of the first frame member 120 including the three cam grooves 121 is molded (by injection molding) as the feature of the eighth embodiment.

Referring to FIGS. 31 to 33, the slide molds 124 comprise three large slide molds 125 and three small slide molds 126. Projected-bending wall surfaces 125a and 126a and projected cam portions 127 and 128 are arranged to outer-peripheral surfaces of the large and the small slide molds 125 and 126, corresponding to the inner-peripheral surface of the first frame member 120. The wall surfaces 125a and 126a of the large and the small slide molds 125 and 126 and the cam portions 127 and 128 mold the single cam groove 121 of the first frame member 120 in cooperation therewith.

Referring to FIG. 31, the three slide molds 124 are cylindrically combined upon using. Referring to FIG. 32, the large and the small slide molds 125 and 126 are closed for the purpose of the molding of the first frame member 120. Referring to FIG. 33, after molding the first frame member 120, the large and the small slide molds 125 and 126 sequentially mold in the three slid molds 124. Namely, the small slide mold 126 is first moved to the center of the optical axis (center of the mold), then the large slide mode 125 is moved to the center of the optical axis (center of the mold) and is opened, and the first frame member 120 is detached from the large and the small slide molds 125 and 126.

That is, a guide portion and a driving portion (not shown) are arranged to the slide mold 124 and the large and the small slide molds 125 and 126 are independently moved in the radial direction (mold pulling-out direction). In the three cylindrically-combined slide molds 124, the large slide mold 125 in one slide mold 124 molds in a direction connecting points VII—VII shown in FIG. 30. Then, the small slide mold 126 in the one slide mold 124 molds in a direction connecting points IV—IV shown in FIG. 30. In this case, the two remaining slide molds 124 mold in a direction having an angle of 120° to the mold pulling-out directions of the large slide mold 125 and the small slide mold 126 in the one slide mold 124 in the circumferential direction of the first frame member 120.

Here, a description is given of the cam structure (shape) of the first frame member 120 which is molded by using three slide molds 124 as another feature of the eighth embodiment of the present invention.

In the first frame member 120, the molding direction of the large slide mold 125 in the slide mold 124 (refer to FIG. 34) is different from that of the small slide mold 126 (refer to FIG. 35). Then, the three cam grooves 121 have bottom portions (cam bottoms) 121a with the same predetermined width corresponding to a moving distance of the second frame member 122. The cam groove 121 includes first wall surfaces 121b and 121d as one pair of first inclined planes having an inclination to increase the widths toward peripheral surfaces (circumferential surfaces 125a and 126a) from the bottom portion, with which taper 123c of the cam follower 123 slidably comes into contact at both-side walls of a bottom portion (cam bottom) 121a. The first wall surfaces 121b and 121d have second wall surfaces 121c and 121e which are substantially in parallel with the molding directions of the large and the small slide molds 125 and 126, as second inclined planes. Referring to FIGS. 34 and 35, reference numeral 120a denotes a parting line which is generated by the combination of the large and the small slide molds 125 and 126.

The bottom portion 121a and the first and the second wall surfaces 121b, 121d, 121c, and 121e of the cam groove 121 in the first frame member 120 include cam edge surfaces 127a and 128a and first cam surfaces 127b and 128b and second cam surfaces 127c and 128c, of projected cam portions 127 and 128 in the large and the small slide molds 125 and 126 in the slide mold 124. The second wall surfaces 121c and 121e are continuously formed through a third wall surface 121f in consideration of the molding inclination of the slide molds 125 and 126 and of the prevention of drop-off of the cam follower 123 so that they are substantially in parallel with each other, with an angle of not less than 1° and not more than 10° to the molding direction on one side. The third wall surface 121f comprises the small slide mold 126. Since the third wall surface 121f is within the moving locus of the large slide mold 125, it is formed with a shape to be out of the moving locus with the molding inclination and is continuous to a second cam surface 127c.

That is, the cam groove 121 of the first frame member 120 comprises: the first and the second wall surfaces 121b and 121c having the first and the second cam surfaces 127b and 127c of the cam portion 127 in the large slide mold 125; and the first and the second wall surfaces 121d and 121e having first and second cam surfaces 128b and 128c of the cam portion 128 in the small slide mold 126.

The first wall surfaces 121b and 121d of the cam groove 121 slidably come into contact with a conical surface (taper surface) of the edge of the cam follower 123, which substantially matches the locus formed by moving a conical portion (taper) of the edge of the cam follower 123. The second wall surface 121c and the third wall portion 121f always have a substantially constant angle to the molding direction of the large slide mold 125. The second wall surface. 121e always has a substantially constant angle to the molding direction of the small slide model 126. As these angles are increased, the molding becomes easy. However, advantageously, these angles are reduced as a function of the eighth embodiment of the present invention. Therefore, preferably, these angles are set to have the molding inclination of not less than 1° and not more than 10° in the parallel direction with the molding direction.

A detailed description is given of the arrangement structure of the cam groove 121 of the first frame member 120 and the cam follower 123 of the second frame member 122 with reference to FIGS. 36A to 36E and FIGS. 37A to 37E. FIGS. 36A to 36E show cross sections near planes including center lines of the cam follower 123 and the optical axis shown in FIG. 30. FIGS. 37A to 37E show cross sections vertical to the center line of the cam groove 121, passing through the center line of the cam follower 123 at the same position of the cam follower 123 as that shown in FIGS. 36A to 36E.

Further, FIGS. 36A to 36E show the cross sections when the cam follower 123 is located on a IV—IV, V—V, VI—VI, VII—VII, and VIII—VIII cross sections shown in FIG. 30. FIGS. 37A to 37E show cross sections vertical to the center line (cam tracing), passing through the center line of the cam follower 123, when the cam follower 123 is at the same position as that shown in FIGS. 36A to 36E. As mentioned above, the position on the cross section IV—IV corresponds to the molding direction of the small slide mold 126 and the position on the cross section VII—VII corresponds to the molding direction of the large slide mold 125. The position on the cross section V—V is near the parting line 120a between the large slide mold 125 and the small slide mold 126 and the positions on the cross sections VI—VI and VIII—VIII are near both ends of the cam groove 121 comprising the large slide mold 125.

As will clearly be understood with reference to FIGS. 37A to 37E, the first wall surfaces 121b and 121d of the cam groove 121 are always set to have substantially the same angle as that of the taper at the edge of the cam follower 123. Since the second wall surfaces 121c are always set to have a substantially constant angle in the molding direction of the large slide mold 125, as shown by the cross sections of FIGS. 37A to 37E passing through the center line of the cam follower 123, the second wall surfaces 121c have the same opening angle on the cross section shown in FIG. 37D matching the molding direction of the large slide mold 125. As the positions of the second wall surfaces 121c are remoter from those in FIG. 37D, one of the second wall surfaces 121c is opened and the other is closed. In this example, the opening angle of the one of the second wall surfaced 121c is approximate to the opening angle of the first wall surfaces 121b on the cross sections of FIGS. 37C and 37E and the other is inside of the first wall surfaces 121b as an under-cut portion in the center-line direction of the cam follower 123. The foregoing is applied to the cases shown in FIGS. 36C and 36E.

The second wall surfaces 121e of the cam groove 121 always have a substantially constant angle in the molding direction of the small slide mold 126. Therefore, on the cross sections shown in FIGS. 37A to 37E passing through the center line of the cam follower 123, the second wall surfaces 121e have the same opening angle on the cross section of FIG. 37A matching the molding direction of the small slide mold 126. However, as the positions of the second wall surfaces 121e are remoter from the positions on the cross section shown in FIG. 37A, the second wall surfaces 121e change so that one of the second wall surfaces 121e is opened and the other is closed. A portion comprising the small slide mold 126 is small and, therefore, the change in opening angle of the second wall surfaces 121e is not increased. However, since the one of the second wall surfaces 121e becomes the third wall surface 121f which is out of the moving locus of the large slide mold 125 at the position on the cross section of FIG. 37B near the parting line 120a, the opening angle of one cam surface is substantially the same as the opening angle of the first wall surfaces 121d. The cam follower 123 has a base end portion 123b to be out of the inner-projected portion of the second wall surfaces 121e.

As mentioned above, in the cam groove 121, the opening angles at most portions on the second wall surfaces 121c and 121e and the third wall surface 121f are smaller than the opening angles on the first wall surfaces 121b and 121d. Thus, when unnecessary external force is applied to the lens barrel, the cam follower 123 has the hook between the large-diameter portion 123d thereof and the second wall surfaces 121a and 121e and therefore it cannot be detached from the cam groove 121 as compared with the case in which the groove 121 has no second wall surfaces 121c and 121e. Since the cam groove 121 has only the first wall surfaces 121*b* and 121*d* which slidably come into contact with the cam follower 123, the opening angles of the second wall surfaces 121*c* and 121*e* and the third wall surface 121*f* different from those of the first wall surfaces 121*b* and 121*d* do not influence on the normal operation and the cam is preferably driven.

The seventh and eighth embodiments uses the barrel structure in which the second frame members 111 and 122 are moved linearly in the optical axis direction by rotating the first frame members 110 and 120. However, the present invention is not limited to this and is applied to the barrel structure in which the first frame members 110 and 120 are moved linearly by rotating the second frame members 111 and 122. Further, the present invention is not limited to the two-barrel structure and can be applied to various structures.

In addition, in the molding method according to the seventh and eighth embodiment, the both surfaces having the constant angle to the molding direction of the slide mold have the same angle. However, they do not necessarily have the same angle. In the example according to the seventh and eighth embodiments, the portion not used for the user's actual operation but only used for the assembling, and the end portion of the cam groove comprise two wall surfaces. However, they may differently be formed.

In addition, the seventh and eighth embodiments use the frame members in which the cam grooves are arranged at equal intervals having the angle of 120°. However, the present invention is not limited to this and always uses neither the three cam grooves nor the cam grooves arranged at the equal intervals. Further, a single slide mold can form a plurality of cam grooves.

According to the seventh and eighth embodiments, (1) it is possible to provide the barrel device comprising the frame member comprising the cam groove having one pair of first wall surfaces inclined from the cam bottom surface in the direction to increase the width and the second wall surface extended from the one pair of first wall surfaces substantially in parallel with the molding direction, and (2) it is possible to provide the barrel device comprising: the first frame member comprising the cam groove having one pair of first wall surfaces inclined from the cam bottom surface in the direction to increase the width and the second wall surface extended from the one pair of first wall surfaces substantially in parallel with the molding direction; and the second frame member having the taper engaged with and slidably touched to the first wall surfaces on the opposed side of the cam groove.

As mentioned above in detail, according to the seventh and eighth embodiments, it is possible to provide the barrel device with the simple structure, which prevents the drop-off of the cam follower under the unnecessary external force to the lens barrel.

The present invention is not limited to the above embodiments and can variously be modified in a wide range without departing from the scope of the invention. Further, the above embodiments includes various modifications of the present invention and the prevent invention can variously be modified by proper combination of a plurality of disclosed components.

For example, when some components are deleted from the entire components according to the above embodiments, the problems to be solved by the present invention can be solved. When the described advantages of the present invention are obtained, the structure for deleting the components can be applied to the present invention.

What is claimed is:

1. An electronic device comprising:
   at least one component defining a ring-shaped or a frustoconical-shaped space; and
   a plurality of printed circuit boards, each having a substantially planer component mounting area and each including notches, wherein the notches define a central portion within lines defined by the notches, and two end portions outside of the lines defined by the notches,
   wherein said plurality of printed circuit boards are arranged in said space such that the planar component mounting areas of adjacent printed circuit boards intersect one another at respective notches, and
   wherein at least one of the plurality of printed circuit boards includes an electrical component on at least one of its two end portions.

2. The electronic device according to claim 1, wherein the at least one component is an interchangeable lens barrel.

3. The electronic device according to claim 2, wherein said plurality of printed circuit boards are rigid printed circuit boards,
   wherein the notches are used to arrange adjacent printed circuit boards together such that the adjacent boards mounting area planes intersect one another, and
   wherein said at least one pair of intersecting printed circuit boards of said plurality of printed circuit boards have connecting lands on each of said at least one pair of printed circuit boards.

4. The electronic device according to claim 3, wherein said connecting lands are physically and electrically connected together by means of solder bridges.

5. The electronic device according to claim 3, wherein said number of said plurality of printed circuit boards is from three to six, wherein the intersecting arrangement of boards forms one of a triangle, a quadrilateral, a pentagon shape, and a hexagon shape.

6. The electronic device according to claim 5, and wherein circuitry included on at least two of said plurality of printed circuit boards in combination forms a lens control portion.

7. The electronic device according to claim 1, wherein said space is ring-shaped, wherein the ring-shaped space has a central axis, wherein each of said plurality of printed circuit boards defines a vector normal to said board component mounting area plane, and wherein each of the normal vectors are substantially orthogonal to said central axis.

8. The electronic device according to claim 7, wherein the electronic device is an interchangeable lens barrel, and wherein the central axis is theoptical axis of the lens barrel.

9. The electronic device according to claim 1, wherein said space is ring-shaped and wherein said plurality of printed-circuit boards are arranged to form a polygon surrounding the central axis.

10. The electronic device according to claim 9, wherein the electronic device is an interchangeable lens barrel, and wherein the central axis is the optical axis of the lens barrel.

11. The electronic device according to claim 1 wherein said plurality of printed circuit boards are rigid printed circuit boards, said electronic device further comprising:
    a lens driving mechanism portion including an actuator; and
    a flexible printed circuit board, wherein said flexible printed circuit board couples at least one of said rigid printed circuit boards to said actuator, and
    wherein said electronic device is an interchangeable lens barrel.

12. The electronic device according to claim 1, wherein the space has a central axis, wherein each of said plurality of printed circuit boards defines a vector normal to said component mounting area plane, and wherein each of the normal vectors is non-orthogonal to said central axis.

13. The electronic device according to claim 12 wherein each of said plurality of circuit boards is substantially trapezoidal in shape.

14. The electronic device according to claim 12, wherein the electronic device is an interchangeable lens barrel, and wherein the central axis is the optical axis of the lens barrel.

15. The electronic device according to claim 12, wherein the plurality of printed circuit boards are arranged polygonally and frustoconically to form an inner shape surrounding the central axis, said inner shape has a polygonal form for a given point along the central axis with the size of the polygon form varying as a function of the point location along the central axis.

16. The electronic device according to claim 15, wherein the electronic device is an interchangeable lens barrel, and wherein the central axis is the optical axis of the lens barrel.

17. An electronic device comprising:
at least one component defining a ring-shaped or a frustoconical-shaped space having a central axis; and
a plurality of printed-circuits boards, each having a substantially planar component mounting area and a vector normal to the component mounting area and each including notches, wherein the notches define a central portion within lines defined by the notches, and two end portions outside of the lines defined by the notches,
wherein said plurality of printed circuit boards are arranged in said space such that each of said plurality of printed circuit boards normal vector is non-orthogonal to said central axis and such that adjacent pairs of the plurality of printed circuit boards intersect one another at notches, and
wherein at least one of the plurality of printed circuit boards includes an electrical component on at least one of its two end portions.

18. The electronic device according to claim 17, wherein the electronic device is an interchangeable lens barrel, and wherein the central axis is the optical axis of the lens barrel.

19. The electronic device of claim 17, wherein said plurality of printed circuit boards are combined and arranged in the space.

20. The electronic device according to claim 19, wherein the electronic device is an interchangeable lens barrel, and wherein the central axis is the optical axis of the lens barrel.

21. The electronic device of claim 17, wherein said plurality of printed circuit boards are rigid printed circuit boards, the electronic device further comprising:
a plurality of flexible printed circuit boards, wherein at least some of said plurality of flexible circuit boards couple together adjacent rigid circuit boards.

22. The electronic device according to claim 21, wherein the electronic device is an interchangeable lens barrel, and wherein the central axis is the optical axis of the lens barrel.

23. The electronic device according to claim 17, wherein each of said plurality of printed circuit boards includes a straight side base, and wherein said plurality of printed circuits boards are arranged to surround the central axis such that the straight line bases of said plurality of printed circuit boards in combination form a polygon shape.

24. The electronic device according to claim 23, wherein the electronic device is an interchangeable lens barrel, and wherein the central axis is the optical axis of the lens barrel.

25. The electronic device of claim 17, wherein said plurality of printed circuit boards are arranged to from a tapered shape surrounding the central axis.

26. The electronic device according to claim 25, wherein the electronic device is an interchangeable lens barrel, and wherein the central axis is the optical axis of the lens barrel.

* * * * *

UNITED STATES PATENT AND TRADEMARK OFFICE
CERTIFICATE OF CORRECTION

| | |
|---|---|
| PATENT NO. | : 7,221,868 B2 |
| APPLICATION NO. | : 11/110155 |
| DATED | : May 22, 2007 |
| INVENTOR(S) | : Tatsuo Takanashi |

It is certified that error appears in the above-identified patent and that said Letters Patent is hereby corrected as shown below:

Title page, item [75], should read as follows

Inventor: TatsuoTAKANASHI

Signed and Sealed this
Twenty-second Day of February, 2011

David J. Kappos
*Director of the United States Patent and Trademark Office*